(12) United States Patent
Otaka

(10) Patent No.: US 10,368,019 B2
(45) Date of Patent: Jul. 30, 2019

(54) SOLID-STATE IMAGING DEVICE, METHOD FOR DRIVING SOLID-STATE IMAGING DEVICE, AND ELECTRONIC APPARATUS

(71) Applicant: Brillnics Japan Inc., Tokyo (JP)

(72) Inventor: Toshinori Otaka, Tokyo (JP)

(73) Assignee: Brillnics Japan Inc., Tokyo (JP)

( * ) Notice: Subject to any disclaimer, the term of this patent is extended or adjusted under 35 U.S.C. 154(b) by 0 days.

(21) Appl. No.: 15/868,128

(22) Filed: Jan. 11, 2018

(65) Prior Publication Data

US 2018/0198997 A1 Jul. 12, 2018

(30) Foreign Application Priority Data

Jan. 12, 2017 (JP) ................. 2017-003245

(51) Int. Cl.
*H04N 5/365* (2011.01)
*H04N 5/353* (2011.01)
*H01L 27/146* (2006.01)
*H04N 5/378* (2011.01)
*H04N 5/374* (2011.01)
*H04N 5/357* (2011.01)
*H04N 5/3745* (2011.01)

(52) U.S. Cl.
CPC ....... *H04N 5/365* (2013.01); *H01L 27/14634* (2013.01); *H04N 5/353* (2013.01); *H04N 5/3575* (2013.01); *H04N 5/3658* (2013.01); *H04N 5/374* (2013.01); *H04N 5/378* (2013.01); *H04N 5/3745* (2013.01)

(58) Field of Classification Search
CPC ...... H04N 5/357; H04N 5/3575; H04N 5/361; H04N 5/363; H04N 5/365; H04N 5/3651; H04N 5/3653; H04N 5/3655; H04N 5/3656; H04N 5/378; H04N 5/3745; H04N 5/37452; H04N 5/369; H04N 5/379; H01L 27/146; H01L 27/14601; H01L 27/14609; H01L 27/14612
See application file for complete search history.

(56) References Cited

U.S. PATENT DOCUMENTS 5,949,483 A * 9/1999 Fossum ............... G11C 19/282
348/303
2016/0381308 A1* 12/2016 Raynor ................. H04N 5/378
348/296

OTHER PUBLICATIONS

Aoki et al., "A Rolling-Shutter Distortion-Free 3D Stacked Image Sensor with −160dB Parasitic Light Sensitivity In-Pixel Storage Node," ISSCC 2013 / Session 27 / Image Sensors / 27.3, cited in the specification (3 pages).

(Continued)

*Primary Examiner* — Paul M Berardesca
(74) *Attorney, Agent, or Firm* — Westerman, Hattori, Daniels & Adrian, LLP

(57) ABSTRACT

A solid-state imaging device which, in a voltage mode, simultaneously samples the pixel signal in all the pixels in a signal holding part serving as the pixel signal storage part, reads converted signals corresponding to readout signals held in a first signal holding capacitor and a second signal holding capacitor to a first signal line, reads converted signals corresponding to readout reset signals simultaneously in parallel to the second signal line, and supplies the same as a differential signal to a column readout circuit. Due to this, a sufficiently low parasitic light sensitivity corresponding to the application can be realized, settling error can be suppressed, and pixel fixed pattern noise can be reduced.

12 Claims, 14 Drawing Sheets

(56) References Cited

OTHER PUBLICATIONS

Oike et al., "An 8.3M-pixel 480fps Global-Shutter CMOS Image Sensor with Gain-Adaptive Column ADCs and 2-on-1 Stacked Device Structure," 2016 Symposium on VLSI Circuits Digest of Technical Papers, cited in the specification (2 pages).
Kondo et al., "3-D-Stacked 16-Mpixel Global Shutter CMOS Image Sensor Using Reliable In-Pixel Four Million Microbump Interconnections With 7.6-μm Pitch," ISSCC Transactions on Electron Devices, vol. 63, No. 1, Jan. 2016, pp. 128-137, cited in the specification.
Meynants et al., "Backside illuminated global shutter CMOS image sensors," IISW 2011, cited in the specification (4 pages).
De Wit et al., "A Low Noise Low Power Global Shutter CMOS Pixel Having Single Readout Capability and Good Shutter Efficiency," IISW 2011, cited in the specification (4 pages).

\* cited by examiner

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATION

The present invention contains subject matter related to Japanese Patent Application No. 2017-3245 filed in the Japan Patent Office on Jan. 12, 2017, the entire contents of which being incorporated herein by reference.

TECHNICAL FIELD

The present invention relates to a solid-state imaging device, a method for driving a solid-state imaging device, and an electronic apparatus.

BACKGROUND ART

As solid-state imaging devices (image sensors) using photoelectric conversion elements which detect light to generate electric charges, CMOS (complementary metal oxide semiconductor) image sensors have been put into practical use. CMOS image sensors are being widely applied as parts of digital cameras, video cameras, monitoring cameras, medical endoscopes, personal computers (PC), mobile phones, and other portable terminal devices (mobile devices) and various other types of electronic apparatuses.

A CMOS image sensor has a floating diffusion (FD) amplifier having, for each pixel, a photodiode (photoelectric conversion element) and floating diffusion layer. For readout, the mainstream type is the column parallel output type that selects a certain row in a pixel array and simultaneously reads the pixels out to a column output direction.

In this regard, in a CMOS image sensor, photo charges which are generated and stored in the photodiodes are sequentially scanned and read out for each of the pixels or each of the rows. When performing this sequential scanning, that is when employing a rolling shutter as an electronic shutter, the start times and end times of exposure for storing photo charges cannot be made to match in all of the pixels. For this reason, in the case of sequential scanning, when capturing an image of a moving subject, there is the problem of occurrence of distortion in a captured image.

Therefore, in capturing an image of a subject moving at a high speed or in sensing applications requiring simultaneity of the captured image where image distortion is not allowed, as the electronic shutter, a global shutter which starts the exposure and ends the exposure at the same timing for all pixels in the pixel array portion is employed.

In a CMOS image sensor employing a global shutter as the electronic shutter, a pixel is, for example, provided with a signal holding part which holds a signal read out from a photoelectric conversion reading part in a signal holding capacitor. In a CMOS image sensor employing a global shutter, simultaneity of the entire image is secured by storing the charges of the photodiodes as voltage signals all together in the signal holding capacitors in the signal holding parts and later sequentially reading them out (see for example NPLT 1). Further, this CMOS image sensor has bypass switches for bypassing the signal holding parts and transferring the outputs of the photoelectric conversion reading parts to signal lines and therefore is configured so as to have a rolling shutter function in addition to a global shutter function.

FIG. 1 is a circuit diagram showing a conventional example of a pixel of a CMOS image sensor employing a global shutter.

A pixel 1 in FIG. 1 includes a photoelectric conversion reading part 2 and a signal holding part 3.

The photoelectric conversion reading part 2 in FIG. 1 includes a photodiode (photoelectric conversion element) and pixel amplifier. The photoelectric conversion reading part 2 has a transfer transistor tg1-Tr, a reset transistor rst1-Tr, a source-follower transistor sf1-Tr, and an output node nd1 with respect to a photoelectric conversion element comprised of a photodiode PD1. The output node nd1 is formed by a source side of the source-follower transistor sf1-Tr. At a gate of the source-follower transistor sf1-Tr, a floating diffusion FD1 is connected.

A signal line lsgn1 between this output node nd1 and the input part of the signal holding part 3 is for example driven by a constant current source I1 arranged at the input part of the signal holding part 3. The source-follower transistor sf1-Tr outputs the readout signal (VSIG) and the read out reset signal (VRST) of the column output, which is obtained by converting the charge in the floating diffusion FD1 to a voltage signal corresponding to the charge amount (potential), to the output node nd1.

The signal holding part 3 of the pixel 1 basically includes an input part 3-1 to which the current source I1 famed by a bypass transistor bs1-Tr is connected, a sample-and-hold part 3-2, an output part 3-3, and nodes nd2 to nd4.

The sample-and-hold part 3-2 has a switch element SW1 which selectively connects the signal holding capacitor of the sample-and-hold part 3-2 with the output node nd1 of the photoelectric conversion reading part 2 of the pixel 1 in the global shutter period, signal holding capacitors C1 and C2 capable of holding the signal output from the output node nd1 of the photoelectric conversion reading part 2 of the pixel 1, and a reset transistor rst3-Tr. The switch element SW1 is connected between the node nd2 and the node nd3 connected to the sample-and-hold part 3-2. The switch element SW1 becomes conductive in for example a period where a signal SH is a high level (H level). The signal holding capacitor C1 is connected between the node nd3 and node nd4. The signal holding capacitor C2 is connected between the node nd4 and a reference potential VSS.

The reset transistor rst3-Tr is connected between a power supply line Vdd of a power supply voltage VDD and controlled by a control signal rst3 supplied to a gate through a control line. The reset transistor rst3-Tr is selected and becomes a conductive state in a reset period where the control signal rst3 is the H level and resets the node nd4 (and capacitors C1 and c2) to the potential of the power supply line of the power supply voltage VDD.

The output part 3-3 includes a source-follower transistor sf3-Tr which outputs signals held in the signal holding capacitors C1 and C2 in accordance with the held voltage in the global shutter period and selectively outputs the held signals through the selection transistor sel3-Tr to the vertical signal line LSGN1 driven by the constant current source.

The source-follower transistor sf3-Tr and the selection transistor sel3-Tr are connected in series between the power supply line Vdd and the vertical signal line LSGN1.

A gate of the source-follower transistor sf3-Tr is connected to the node nd4. The selection transistor sel3-Tr is controlled by a control signal sel3 supplied to the gate through a control line. The selection transistor sel3-Tr is selected and becomes a conductive state in the selection period where the control signal sel3 is the H level. Due to this, the source-follower transistor sf3-Tr outputs the readout voltage (VRST, VSIG) of the column output in accordance with the held voltages of the signal holding capacitors C1 and C2 to the vertical signal line LSGN1.

The stacked type CMOS image sensor disclosed in NPLT 1 has a stacked structure of a first substrate (pixel die) and a second substrate (ASIC die) connected through microbumps (connecting parts). Further, the photoelectric conversion reading parts of the pixels are formed on the first substrate, while the signal holding parts of the pixels, signal lines, vertical scanning circuit, horizontal scanning circuit, column readout circuit, and so on are formed on the second substrate.

CITATION LIST

Non-Patent Literature

NPLT 1: J. Aoki et al., "A Rolling-Shutter Distortion-Free 3D Stacked Image Sensor with −160 dB Parasitic Light Sensitivity In-Pixel Storage Node" ISSCC 2013/SESSION 27/Image SENSORS/27.3.
NPLT 2: Yusuke Oike, et al., "An 8.3M-pixel 480 fps Global-Shutter CMOS Image Sensor with Gain-Adaptive Column ADCs and 2-on-1 Stacked Device Structure", 2016 Symposium on VLSI Circuits and Digest of Technical Papers.
NPLT 3: Toru Kondo et al., "3-D-Stacked 16-Mpixel Global Shutter CMOS Image Sensor Using Reliable In-Pixel Four Million Microbump Interconnections With 7.6-μm Pitch", ISSCC 2016.
NPLT 4: Guy Meynants et al., "Backside Illuminated Global Shutter CMOS Image Sensors", IISW 2011.
NPLT 5: Yannick De Wit et al., "A Low Noise Low Power Global Shutter CMOS Pixel Having Single Readout Capability And Good Shutter Efficiency", IISW 2011.

SUMMARY OF INVENTION

Technical Problem

However, in the above described conventional CMOS image sensor having a global shutter function, since signal holding is realized by charge division between two capacitors C1 and C2, there is a problem that in a normal capacitance configuration, the sampling gain becomes 0.5. When the gain becomes 0.5, there are the disadvantageous that the signal amplitude as a result of the photoelectric conversion is halved, the ratio (S/N ratio) to the noise of the column amplifier and the AD converter of the subsequent stage is reduced, and the image quality (IQ) is generally reduced.

Further, in order to realize the global shutter function with a conventional CMOS image sensor, the photo signal charge photoelectrically converted by the photodiode is transferred to and stored in the storage node of the adjacent signal holding part. However, since the photoelectric conversion part and the charge storage part are arranged (present) on the same focal plane, there is a problem that parasitic light photosensitivity (PLS) significantly deteriorates when backside illumination type pixels that realize high sensitivity are used. Further, even with a surface illumination type pixel, there are the problems of the phenomenon of light reflected at the wiring layer many times striking the storage node or the charge photoelectrically converted at the deep part of the substrate being stochastically mixed in the storage node and sufficient PLS performance unable to be realized as a specific application of a camera.

For example, in the prior art shown in NPLT 2, a storage node is formed adjacent to a pixel. In the storage node, it is necessary to hold all of the charge generated in the pixel, so the storage node itself must also be made large. As a result, the pixel aperture ratio (sensitivity) and the saturated electron number of the photodiode itself are lowered. Further, an overflow drain transistor that induces charge leakage when intense light enters the pixel is added, but this transistor also causes sensitivity and saturated electron number to decrease. If it is desired to increase the number of saturated electrons, a large storage node is required. However, by increasing the area of the storage node, the number of electrons that the storage node can hold increases, but conversely the number of saturated electrons and sensitivity of the photodiode decreases and the PLS also deteriorates. That is, there is a big problem that the sensitivity, PLS, and saturated electron number are in a trade-off state. Further, since these pixels have a structure greatly different from conventionally developed rolling shutter pixels, double pixel development is required. That is, there is also a problem in tams of development cost that good pixels developed for the rolling shutter pixels cannot be used as they are or the like.

On the other hand, in the prior art shown in NPLT 3, a CMOS image sensor is stacked. Backside illumination type pixels are mounted on a die (CIS die) on which light is incident, while circuits for sampling the output voltage from the pixels are mounted on a die (ASIC die) stacked under the CIS die. In this configuration, the CIS die and the ASIC die are electrically connected by die-to-die vias (VIA) at the pixel level. Further, by shielding the sampling circuit of the ASIC die with a metal wiring layer, it is possible to completely block the light transmitted from the CIS die. As a result, a PLS performance of −160 dB has been realized. An excellent image sensor realizing a performance equal to or higher than a mechanical shutter in conventional cameras is realized by a chip structure and electronic shutter.

However, in the sampling circuit configuration of the NPLT 3, there is a problem that the sampling gain becomes 0.5 in the normal capacity configuration. When the gain becomes 0.5, there are the disadvantageous that the signal amplitude as a result of the photoelectric conversion is halved, the ratio (S/N ratio) to the noise of the column amplifier and the AD converter of the subsequent stage is reduced, and the image quality (IQ) is generally reduced. On the other hand, although the gain can be increased to 0.8 by setting the capacitive coupling and the capacity ratio of sampling to 4:1, due to the decrease in sampling capacity, the result is strongly affected by vertical shading caused by difference in the signal storage period for each row and, as a result, the image quality is deteriorated.

Further, also in the sampling circuit configuration disclosed in NPLT 4, although the resistance to vertical shading is high, there remains a problem that the sampling gain becomes <0.5. When two sampling capacitors are short-circuited, the gain decreases depending on the channel capacity of the switch transistor and the capacitance of the gate terminal, and pixel fixed pattern noise due to manufacturing variations is increased.

Furthermore, in NPLTs 3 and 4, a source-follower amplifier of the CIS die is driven by a constant current source. In this case, since a constant current source is provided for each pixel, even if the current is as small as 0.1 μA, 1 A instantaneously flows in the case of 10M pixels.

When such a large current flows, there is a problem of di/dt noise due to parasitic inductance in the lead frame and wiring between the die and the package, and latchup due to the parasitic bipolar transistor becomes a problem.

For example, in the prior art shown in NPLT 5, the sampling capacitance is reset to 0V and the source-follower amplifier of the pixel is driven by using the sampling capacitance as a dynamic current source. As a result, instantaneous current can be suppressed and low power consumption is achieved. However, since the load capacitance when driving the FD reset voltage and the load capacitance when driving the PD photo signal voltage are different, an offset difference (settling error) occurs in the settling. Since that is different for each pixel, it becomes pixel fixed pattern noise and lowers image quality. In order to alleviate this, it is sufficient to lengthen the sampling period. However, in the global shutter which is required for machine vision use, since a high frame rate is required, lengthening the sampling period becomes a problem.

The present invention provides a solid-state imaging device, a method for driving a solid-state imaging device, and an electronic apparatus capable of realizing a sufficiently low parasitic light sensitivity according to the application, suppressing settling error, and capable of reducing pixel fixed pattern noise.

Solution to Problem

A solid-state imaging device of a first aspect of the present invention comprises a pixel portion in which are arranged pixels including photoelectric conversion reading parts and signal holding parts, a readout portion for reading pixel signals from the pixel portion, and a first signal line and a second signal line to which held signals of the signal holding part are output, wherein a pixel signal read out from a pixel is a pixel signal including at least a readout signal and a readout reset signal, a photoelectric conversion reading part of a pixel includes at least an output node, a photoelectric conversion element which stores a charge generated by photoelectric conversion in a storage period, a transfer element capable of transferring the charge stored in the photoelectric conversion element in a transfer period, a floating diffusion to which the charge stored in the photoelectric conversion element is transferred through the transfer element, a first source-follower element which converts the charge of the floating diffusion to a voltage signal corresponding to the charge amount and outputs the converted signal to the output node, and a reset element which resets the floating diffusion to a predetermined potential in a reset period, and a signal holding part includes an input node, a first signal holding capacitor capable of holding a readout signal output from the output node of the photoelectric conversion reading part of the pixel and input to the input node, a second signal holding capacitor capable of holding a readout reset signal output from the output node of the photoelectric conversion reading part of the pixel and input to the input node, a first switch element which selectively connects the first signal holding capacitor with the output node of the photoelectric conversion reading part, a second switch element which selectively connects the second signal holding capacitor with the output node of the photoelectric conversion reading part, a first output part including a second source-follower element which outputs a signal held in the first signal holding capacitor in accordance with a held voltage and selectively outputting the converted signal to the first signal line, and a second output part including a third source-follower element which outputs a signal held in the second signal holding capacitor in accordance with a held voltage and selectively outputting the converted signal to the second signal line.

A second aspect of the present invention is a method for driving a solid-state imaging device having a pixel portion in which are arranged pixels including photoelectric conversion reading parts and signal holding parts, a readout portion for reading pixel signals from the pixel portion, a first signal line and a second signal line to which held signals of the signal holding part are output, wherein a pixel signal read out from a pixel is a pixel signal including at least a readout signal and a readout reset signal, a photoelectric conversion reading part of a pixel includes at least an output node, a photoelectric conversion element which stores a charge generated by photoelectric conversion in a storage period, a transfer element capable of transferring the charge stored in the photoelectric conversion element in a transfer period, a floating diffusion to which the charge stored in the photoelectric conversion element is transferred through the transfer element, a first source-follower element which converts the charge of the floating diffusion to a voltage signal corresponding to the charge amount and outputs the converted signal to the output node, and a reset element which resets the floating diffusion to a predetermined potential in a reset period, and a signal holding part includes an input node, a first signal holding capacitor capable of holding a readout signal output from the output node of the photoelectric conversion reading part of the pixel and input to the input node, a second signal holding capacitor capable of holding a readout reset signal output from the output node of the photoelectric conversion reading part of the pixel and input to the input node, a first switch element which selectively connects the first signal holding capacitor with the output node of the photoelectric conversion reading part, a second switch element which selectively connects the second signal holding capacitor with the output node of the photoelectric conversion reading part, a first output part including a second source-follower element which outputs a signal held in the first signal holding capacitor in accordance with a held voltage and selectively outputting the converted signal to the first signal line, and a second output part including a third source-follower element which outputs a signal held in the second signal holding capacitor in accordance with a held voltage and selectively outputting the converted signal to the second signal line, the method for driving a solid-state imaging device comprising, when reading a pixel signal of a pixel, connecting a drain side of the first source-follower element to a power supply potential, when reading a readout signal as the pixel signal from the pixel, making the first switch element of the signal holding part conductive for a predetermined period and holding the readout signal in the first signal holding capacitor, when reading the readout reset signal as the pixel signal from the pixel, making the second switch element of the signal holding part conductive for another predetermined period and holding the readout reset signal in the second signal holding capacitor and, in a state in which the first switch element and the second switch element are held in a nonconductive state, reading the converted signal corresponding to the readout signal to the first signal line by the first output part and reading the converted signal corresponding to the readout reset signal simultaneously in parallel to the second signal line by the second output part.

An electronic apparatus of a third aspect of the present invention has a solid-state imaging device and an optical system forming a subject image in the solid-state imaging device, wherein the solid-state imaging device has a pixel portion in which are arranged pixels including photoelectric conversion reading parts and signal holding parts, a readout portion for reading pixel signals from the pixel portion, and a first signal line and a second signal line to which held signals of the signal holding part are output, wherein the pixel signal read out from the pixel is a pixel signal including at least a readout signal and a readout reset signal, a photoelectric conversion reading part of a pixel includes at least an output node, a photoelectric conversion element which stores a charge generated by photoelectric conversion in a storage period, a transfer element capable of transferring a charge stored in the photoelectric conversion element in a transfer period, a floating diffusion to which the charge stored in the photoelectric conversion element is transferred through the transfer element, a first source-follower element which converts the charge of the floating diffusion to a voltage signal corresponding to the charge amount and outputs the converted signal to the output node, and a reset element which resets the floating diffusion to a predetermined potential in a reset period, and a signal holding part includes an input node, a first signal holding capacitor capable of holding a readout signal output from the output node of the photoelectric conversion reading part of the pixel and input to the input node, a second signal holding capacitor capable of holding a readout reset signal output from the output node of the photoelectric conversion reading part of the pixel and input to the input node, a first switch element which selectively connects the first signal holding capacitor with the output node of the photoelectric conversion reading part, a second switch element which selectively connects the second signal holding capacitor with the output node of the photoelectric conversion reading part, a first output part including a second source-follower element which outputs a signal held in the first signal holding capacitor in accordance with a held voltage and selectively outputting the converted signal to the first signal line, and a second output part including a third source-follower element which outputs a signal held in the second signal holding capacitor in accordance with a held voltage and selectively outputting the converted signal to the second signal line.

Advantageous Effects of Invention

According to the present invention, a sufficiently low parasitic light sensitivity according to the application can be realized, settling error can be suppressed, and pixel fixed pattern noise can be reduced.

DESCRIPTION OF EMBODIMENTS

Below, embodiments of the present invention will be explained with reference to the drawings.

First Embodiment

Figure 2:
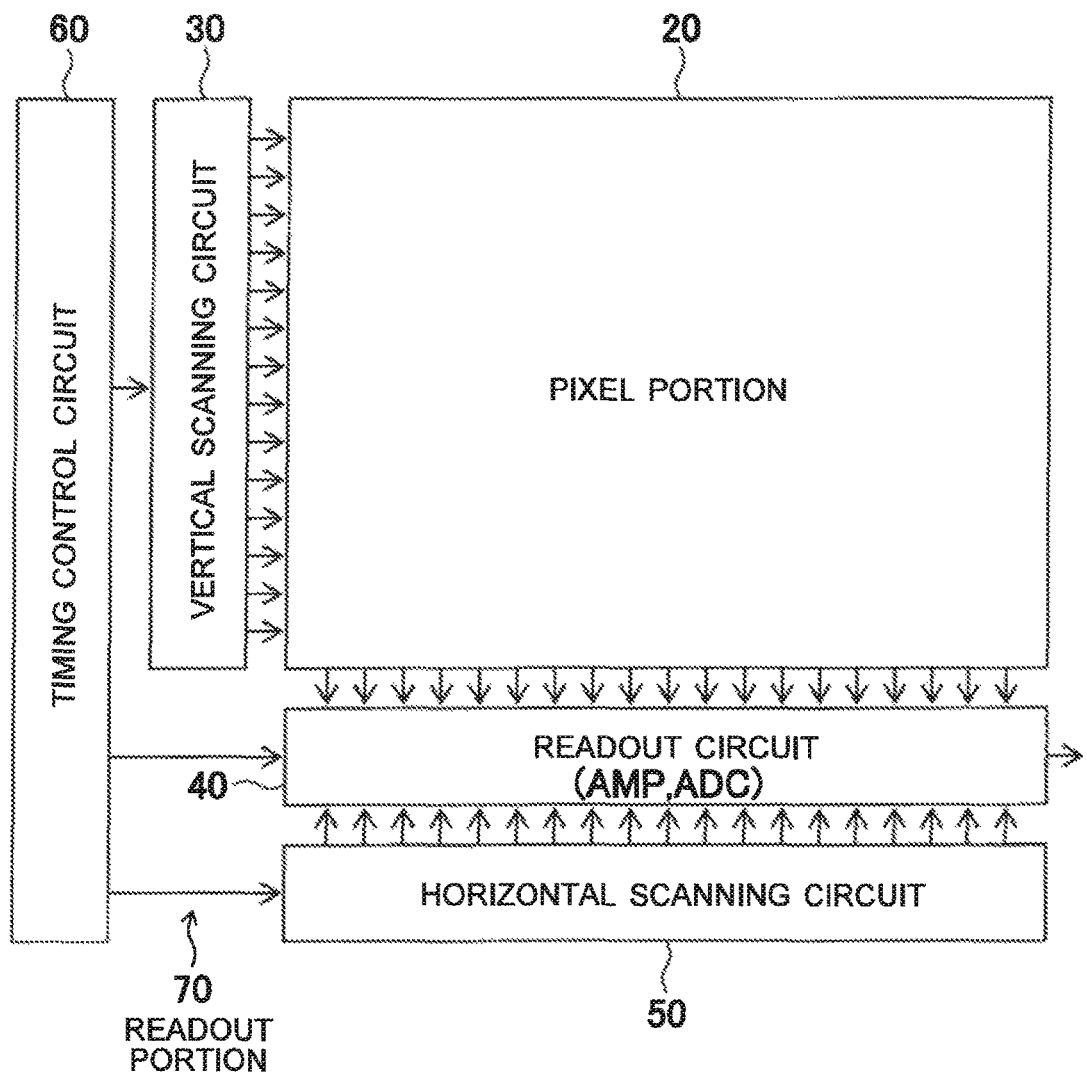
FIG. 2 is a block diagram showing an example of the configuration of a solid-state imaging device according to a first embodiment of the present invention.

FIG. 2 is a block diagram showing an example of the configuration of a solid-state imaging device according to a first embodiment of the present invention. In the present embodiment, a solid-state imaging device 10 is for example configured by a CMOS image sensor.

Figure 1:
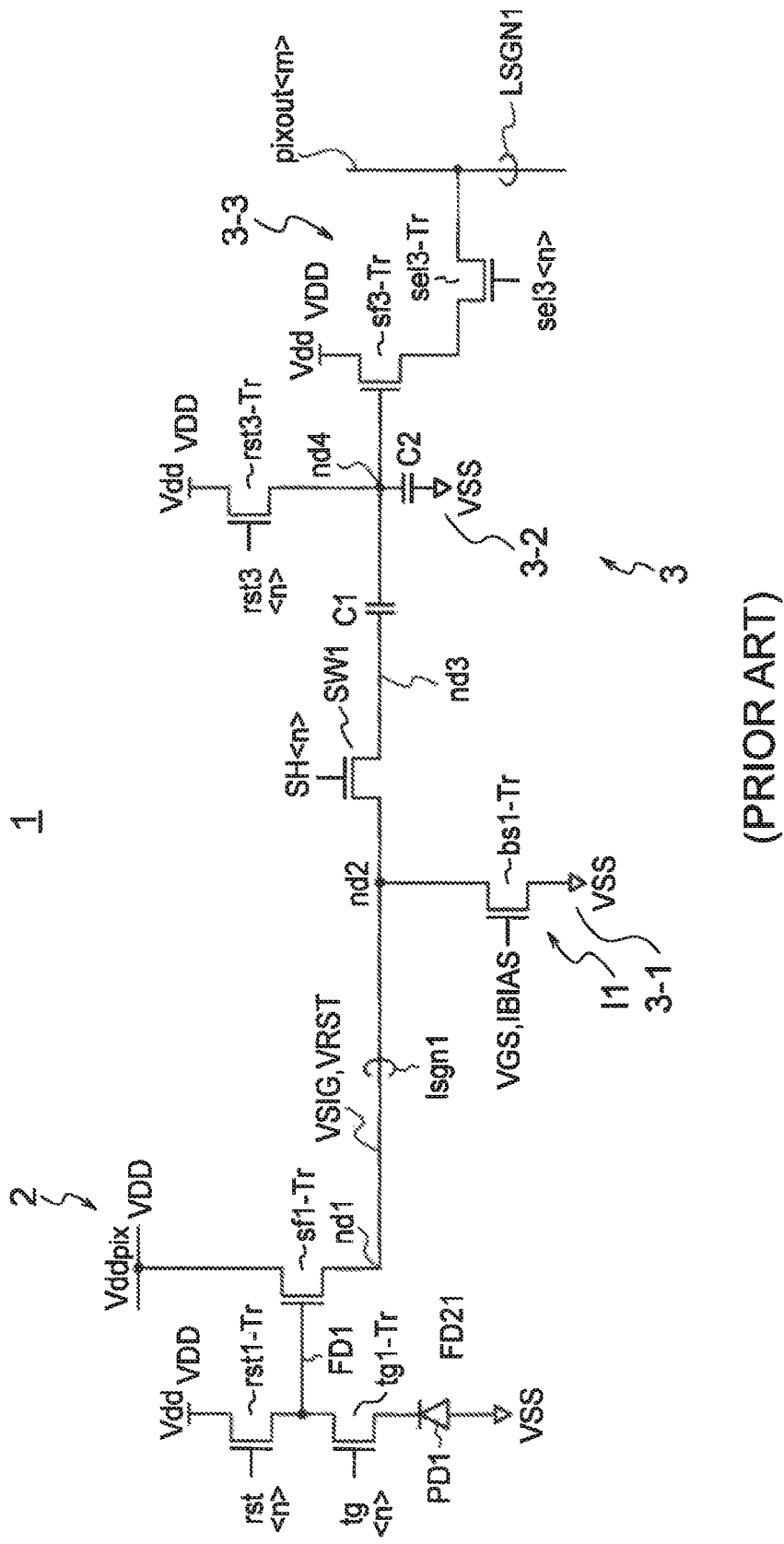
FIG. 1 is a circuit diagram showing a conventional example of a pixel of a CMOS image sensor employing a global shutter.

This solid-state imaging device 10, as shown in FIG. 1, has a pixel portion 20 as an imaging part, a vertical scanning circuit (row scanning circuit) 30, readout circuit (column readout circuit) 40, horizontal scanning circuit (column scanning circuit) 50, and timing control circuit 60 as principal components. Among these components, for example, the vertical scanning circuit 30, column readout circuit 40, horizontal scanning circuit 50, and timing control circuit 60 configure a readout portion 70 of pixel signals.

In the first embodiment, the solid-state imaging device 10 is configured as for example a stacked type CMOS image sensor having a pixel portion 20 comprised of pixels each including a photoelectric conversion reading part and signal holding part and having an operation function of a global shutter. The solid-state imaging device 10 according to the first embodiment, as will be explained in detail later, in the voltage mode, simultaneously samples the pixel signal in all the pixels in the signal holding part serving as the pixel signal storage part, reads the converted signals corresponding to readout signals held in a first signal holding capacitor and a second signal holding capacitor to a first signal line, and reads the converted signals corresponding to readout reset signals simultaneously in parallel to a second signal line, and supplies the same as a differential signal to the column readout circuit 40.

Below, outlines of the configurations and functions of the parts of the solid-state imaging device 10, particularly, the configuration and function of the pixel portion 20, readout processing related to them, the stacked structures of the pixel portion 20 and readout portion 70, and so on, will be explained in detail.

Configurations of Pixels and Pixel Portion 20

Figure 3:
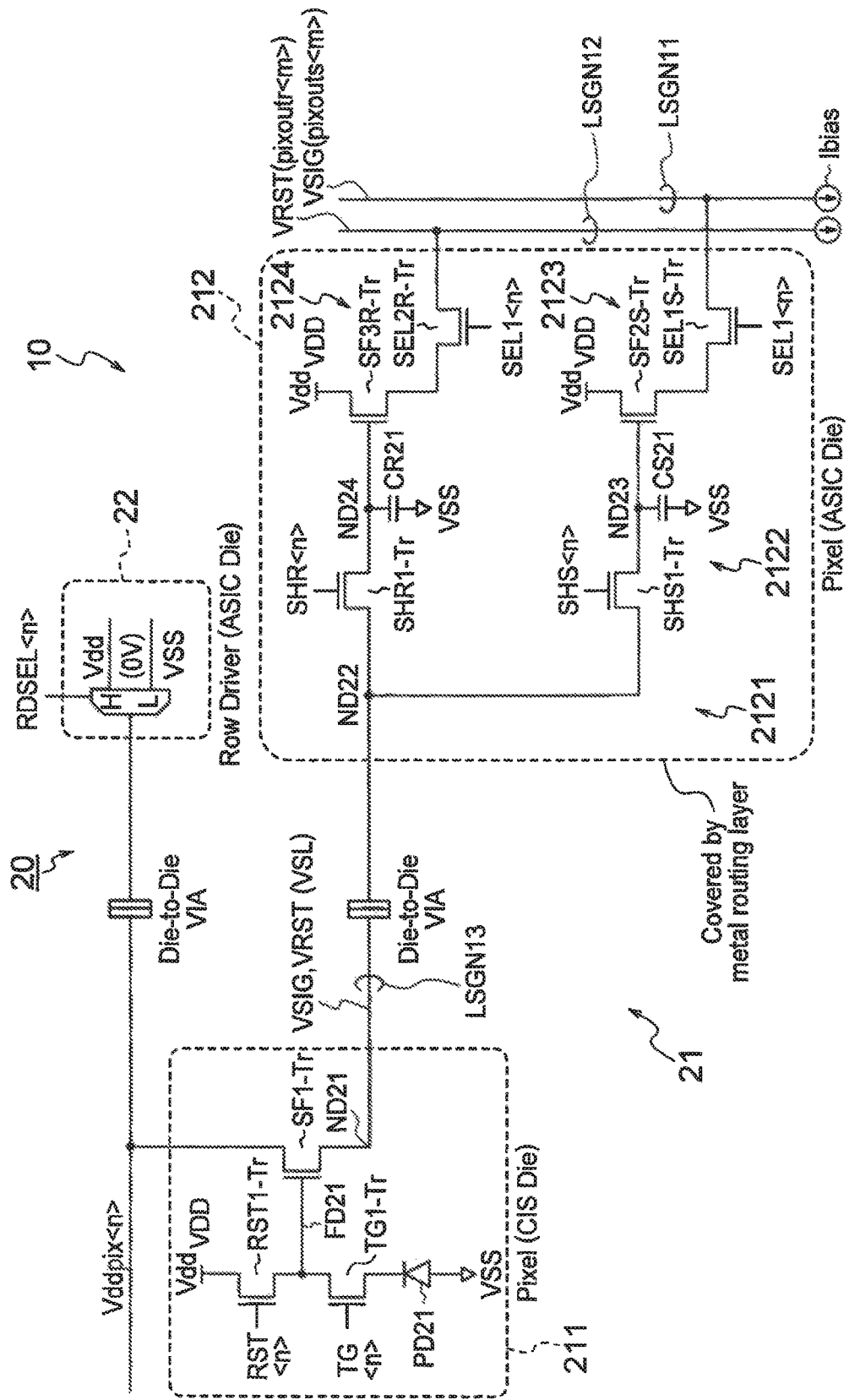
FIG. 3 is a circuit diagram showing an example of a pixel of the solid-state imaging device according to the first embodiment of the present invention.

FIG. 3 is a circuit diagram showing an example of a pixel of the solid-state imaging device 10 according to the first embodiment of the present invention.

A pixel 21 arranged in the pixel portion 20 includes a photoelectric conversion reading part 211 and a signal holding part 212. In the pixel portion 20 of the first embodiment, the power source switching portion 22 is arranged corresponding to a pixel 21 or corresponding to a plurality of the pixels 21.

The photoelectric conversion reading part 211 of the pixel 21 includes a photodiode (photoelectric conversion element) and pixel amplifier. Specifically, this photoelectric conversion reading part 211 has for example a photoelectric conversion element comprised of a photodiode PD21. This photodiode PD21 is provided with a transfer element comprised of a transfer transistor TG1-Tr, a reset element comprised of a reset transistor RST1-Tr, a source-follower element comprised of a source-follower transistor SF1-Tr, and an output node ND21. In this way, the photoelectric conversion reading part 211 of the pixel 21 according to the first embodiment includes three transistors (3Tr) of the transfer transistor TG1-Tr, reset transistor RST1-Tr, and source-follower transistor SF1-Tr.

In the photoelectric conversion reading part 211 according to the first embodiment, an output node ND21 is connected to the input part of the signal holding part 212 of the pixel 21. The photoelectric conversion reading part 211 outputs a readout signal (signal voltage, VSIG) and a readout reset signal (signal voltage, VRST) to the signal holding part 212 at the time of the global shutter mode.

In the first embodiment, the first vertical signal line LSGN11 and the second vertical signal line LSGN12 are driven by a constant current source Ibias at the time of the global shutter mode.

The photodiode PD21 generates and stores an amount of signal charge (here, electrons) corresponding to an incident light quantity. Below, a case where a signal charge is electrons and each transistor is an n-type transistor will be explained, however, the signal charge may be a hole or each transistor may be a p-type transistor. Further, the present embodiment is effective also in a case where each transistor is shared among a plurality of photodiodes and transfer transistors.

The transfer transistor TG1-Tr in the photoelectric conversion reading part 211 is connected between the photodiode PD21 and the floating diffusion FD21 and is controlled by a control signal TG supplied to the gate through a control line. The transfer transistor TG1-Tr is selected and becomes conductive in a transfer period where the control signal TG is a high (H) level and transfers the charge (electron) which is photoelectrically converted and stored in the photodiode PD21 to the floating diffusion FD21.

The reset transistor RST1-Tr is connected between a power supply line Vdd of a power supply voltage VDD and the floating diffusion FD21 and is controlled by a control signal RST supplied to the gate through a control line. The reset transistor RST1-Tr is selected and becomes conductive in a reset period where the control signal RST is the H level and resets the floating diffusion FD21 to the potential of the power supply line Vdd of the power supply voltage VDD.

The first source-follower element comprised of the source-follower transistor SF1-Tr has a source connected to the output node ND 21, a drain side connected to the power supply switching part 22 through the power supply line Vddpix, and a gate connected to the floating diffusion FD 21. The signal line LSGN 13 between the output node ND 21 and the input part of the signal holding part 212 is driven by, for example, a capacitor or a constant current source arranged in the signal holding part 212

When reading out the pixel signal, the source of the source-follower transistor SF1-Tr is connected to the power supply line Vdd of the power supply voltage VDD by the power by the power supply switching part 22. In this case, the source-follower transistor SF1-Tr outputs the readout signal (VSIG 1) and the readout reset signal (VRST 1) of the column output obtained by converting the charge of the floating diffusion FD 21 to a voltage signal corresponding to the charge amount (potential) to the output node ND 21.

When clearing the first signal holding capacitor and the second signal holding capacitor of the signal holding part 212, the drain side of the source-follower transistor SF1-Tr is connected to the reference potential VSS (for example, ground level 0V) by the power supply switching part 22. In this case, the gate (the floating diffusion FD 21) of the source-follower transistor SF1-Tr is reset to the potential of the power supply line Vdd by the reset transistor RST1-Tr. That is, when clearing the first signal holding capacitor and the second signal holding capacitor of the signal holding part 212, the source-follower transistor SF1-Tr functions merely as a switch.

The signal holding part 212 of the pixel 21 basically includes an input part 2121 including an input node ND22, a sample-and-hold part 2122, a first output part 2123, a second output part 2124, and nodes ND23 and ND24.

The input part 2121 is connected to the output node ND21 of the photoelectric conversion reading part 211 through a third signal line LSGN13 and inputs the readout signal (VSIG1) and the readout reset signal (VRST1) output from the output node ND21 to the sample-and-hold part 2122.

The sample-and-hold part 2122 includes a first switch element comprised of a first sampling transistor SHS1-Tr, a second switch element comprised of a second sampling transistor SHR1-Tr, a first signal holding capacitor CS21, and a second signal holding capacitor CR22.

The first sampling transistor SHS1-Tr is connected between the input node ND22 connected to the third signal line LSGN13 and the holding node ND23. The first sampling transistor SHS1-Tr selectively connects the first signal holding capacitor CS21 of the sample-and-hold part 2122 to the output node ND21 of the photoelectric conversion reading part 211 through the holding node ND23 in the global shutter period or the clearing period. The first sampling transistor SHS1-Tr becomes the conductive state, for example, during the period when the control signal SHS is at the high level. The first signal holding capacitor CS21 is connected between the holding node ND23 and the reference potential VSS.

The second sampling transistor SHR1-Tr is connected between the input node ND22 connected to the third signal line LSGN13 and the holding node ND24. The second sampling transistor SHR1-Tr selectively connects the second signal holding capacitor CR21 of the sample-and-hold part 2122 to the output node ND21 of the photoelectric conversion reading part 211 through the holding node ND24 in the global shutter period or the clearing period. The second sampling transistor SHR1-Tr becomes a conductive state, for example, during the period when the control signal SHR is at the high level. The second signal holding capacitor CR21 is connected between the holding node ND24 and the reference potential VSS.

The first sampling transistor SHS1-Tr and the second sampling transistor SHR1-Tr are formed by MOS transistors, for example, n-channel MOS (NMOS) transistors.

The first output part 2123 includes a second source-follower transistor SF2S-Tr which basically outputs signals held in the first signal holding capacitor CS21 in accordance with the held voltage in the global shutter period and selectively outputs the held signals through the selection transistor SEL1S-Tr to the first vertical signal line LSGN11 driven by the constant current source Ibias.

The source-follower transistor SF2S-Tr and the selection transistor SEL1S-Tr are connected in series between the power supply line Vdd and the first vertical signal line LSGN11.

The gate of the source-follower transistor SF2S-Tr is connected to the holding node ND23. The selection transistor SEL1S-Tr is controlled by a control signal SEL1 supplied to the gate through a control line. The selection transistor SEL1S-Tr is selected and becomes conductive in the selection period where the control signal SEL1 is the H level. Due to this, the source-follower transistor SF2S-Tr outputs the read-out voltage (VSIG) of the column output in accordance with the held voltages of the first signal holding capacitors CS21 to the first vertical signal line LSGN11.

The second output part 2124 includes a third source-follower transistor SF3R-Tr which basically outputs signals held in the second signal holding capacitor CR21 in accordance with the held voltage in the global shutter period and selectively outputs the held signals through the selection transistor SEL2R-Tr to the second vertical signal line LSGN12 driven by the constant current source Ibias.

The source-follower transistor SF3R-Tr and the selection transistor SEL2R-Tr are connected in series between the power supply line Vdd and the second vertical signal line LSGN12.

The gate of the source-follower transistor SF3R-Tr is connected to the holding node ND24. The selection transistor SEL2R-Tr is controlled by a control signal SEL1 supplied to the gate through a control line. The selection transistor SEL1S-Tr is selected and becomes conductive in the selection period where the control signal SEL1 is the H level. Due to this, the source-follower transistor SF3R-Tr outputs the read-out voltage (VRST) of the column output in accordance with the held voltages of the second signal holding capacitor CR21 to the second vertical signal line LSGN12.

In this way, the solid-state imaging device 10 according to the first embodiment, in the voltage mode, simultaneously samples the pixel signal in all the pixels in the signal holding part 212 serving as the pixel signal storage part, reads the converted signals corresponding to readout signals held in a first signal holding capacitor CS21 and a second signal holding capacitor CR21 to a first signal line LSGN11, reads the converted signals corresponding to readout reset signals simultaneously in parallel to a second signal line LSGN12, and supplies the same as a differential signal to the column readout circuit 40.

In the solid-state imaging device 10 according to the first embodiment, there is no constant current source for driving the third signal line LSGN13 between the output node ND21 of the photoelectric conversion reading part 211 and the input part of the signal holding part 212 arranged at for example the input part 2121 of the signal holding part 212. The third signal line LSGN13 is driven by a dynamic current source provided by the first signal holding capacitor CS21 and the second signal holding capacitor CR21.

Both capacitors of the first signal holding capacitor CS21 and the second signal holding capacitor CR21 are cleared to 0V in the clearing period. When these capacitors are connected to the source-follower transistor SF1-Tr of the photoelectric conversion reading part 211, the electrons are provided by the first signal holding capacitor CS21 and the second signal holding capacitor CR21. Accordingly, the first signal holding capacitor CS21 and the second signal holding capacitor CR21 function as a dynamic current source.

The power supply switching part 22 is connected to the power supply line Vddpix which is connected to the drain of the source-follower transistor SF1-Tr of the photoelectric conversion reading part 211. The power supply switching part 22 connects the power supply line Vddpix to the power supply line Vdd of the power supply potential VDD or the reference potential VSS according to the control signal RDSEL. For example, during the clearing period, the control signal RDSEL is set to the L level, and the power supply switching part 22 connects the power supply line Vddpix to the reference potential VSS. On the other hand, in the global shutter period, the control signal RDSEL is set to the H level, and the power supply switching part 22 connects the power supply line Vddpix to the power supply line Vdd of the power supply potential VDD.

Figure 4:
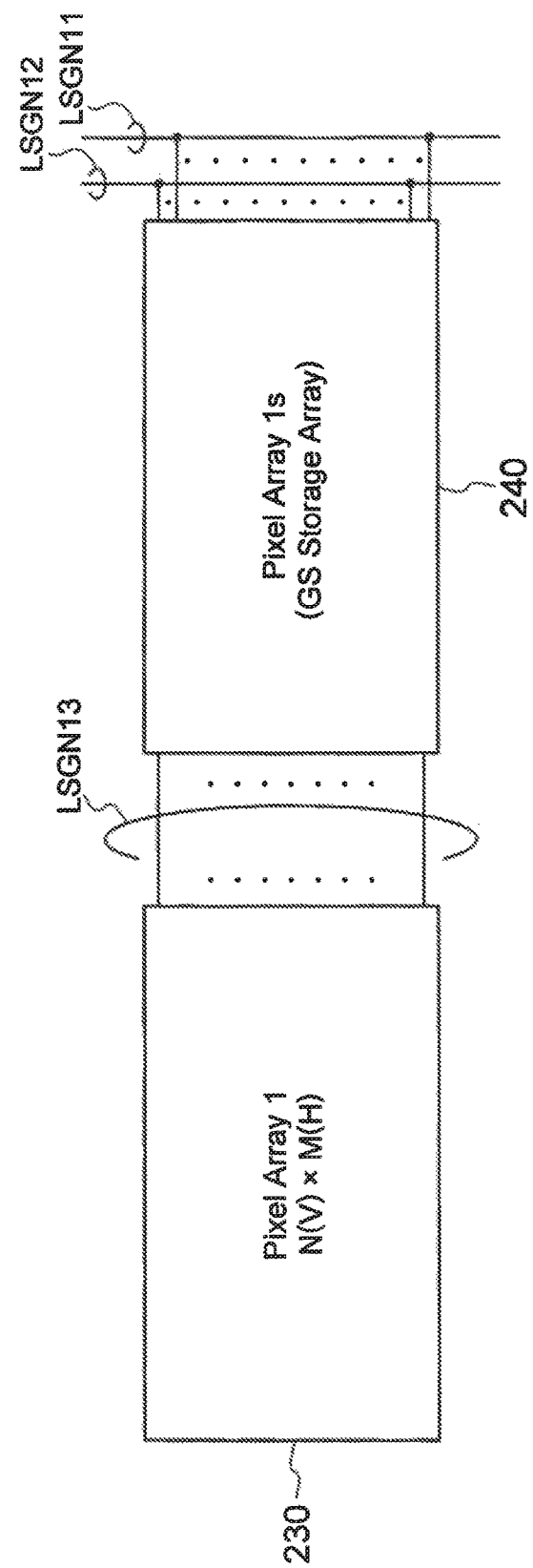
FIG. 4 is a view for explaining a pixel array in a pixel portion of the solid-state imaging device according to the first embodiment of the present invention.

The pixel portion 20 according to the first embodiment is comprised of pixels 21 having the configurations described above for example arranged as a pixel array as shown in FIG. 4. A plurality of pixel arrays are combined.

FIG. 4 is a view for explaining a pixel array in the pixel portion 20 in the solid-state imaging device 10 according to the first embodiment of the present invention.

The pixel portion 20 in the solid-state imaging device 10 according to the first embodiment includes a pixel array 230 and a holding part array 240.

In the pixel array 230, the plurality of photoelectric conversion reading parts 211 of the pixels 21 are arranged in a two-dimensional matrix comprised of N rows and M columns. In the pixel array 230, for example, the plurality of photoelectric conversion reading parts 211 of the pixels 21 are arranged in a two-dimensional matrix comprised of N rows and M columns so that an image having an aspect ratio of for example 16:9 can be output.

In the holding part array 240, corresponding to the pixel array 230, the plurality of signal holding parts 212 of the pixels 21 are arranged in a two-dimensional matrix comprised of N rows and M columns. In the holding part array 240, in the same way as the pixel array 230, the plurality of signal holding parts 212 of the pixels 21 are arranged in the two-dimensional matrix comprised of N rows and M columns so that an image having an aspect ratio of for example 16:9 can be output.

As will be explained later, when the solid-state imaging device 10 has a stacked structure of a first substrate (upper substrate) and a second substrate (lower substrate), the pixel array 230 is formed on the first substrate, while the holding part array 240 is formed on the second substrate so as to face the first pixel array 230. In this case, the holding part array may be completely shielded from light by a metal wiring layer.

In the pixel portion 20, under control of the readout portion 70, at the time of the global shutter mode, the pixel array 230 and the holding part array 240 are made active so that the pixel signals are read out.

In the pixel portion 20, the reset transistor RST1-Tr and the transfer transistor TG1-Tr are used to simultaneously reset the photodiode for all pixels, so that exposure is started simultaneously in parallel for all pixels. After the predetermined exposure period has ended, the output signal from the photoelectric conversion reading part 211 is sampled by the signal holding part 212 by using the transfer transistor TG1-Tr, and the exposure is ended simultaneously in parallel for all pixels. Due to this, a complete shutter operation can be realized electronically.

In the pixel portion 20, the pixels are arranged in N rows and M columns, therefore the number of each of the control lines LSEL, LRST, and LTG is N and the number of each of the first vertical signal lines LSGN11 and second vertical signal lines LSGN12 is M. In FIG. 2, the row control lines are represented by a single row scanning control line. In the same way, the vertical signal lines LSGN11 and LSGN12 are represented by a single vertical signal line.

The vertical scanning circuit 30 drives the photoelectric conversion reading parts 211 and signal holding parts 212 in the pixels 21 through the row scanning control lines in the shutter rows and read rows according to the control by the timing control circuit 60. Further, the vertical scanning circuit 30 outputs row selection signals of the row address of the reading row for reading the signals and of the shutter row for resetting the charges stored in the photodiodes PD according to an address signal.

The column readout circuit 40 may be configured so as to include a plurality of column signal processing circuits (not shown) arranged corresponding to the column output of the pixel portion 20 so that column parallel processing is possible by the plurality of column signal processing circuits. In the global shutter mode, the column readout circuit 40 performs amplification processing and AD conversion processing with respect to the differential pixel signal pixout (VSL) read from the signal holding unit 212 of a pixel 21 to the first vertical signal line LSGN11 and the second vertical signal line LSGN12.

Here, the pixel signal pixout (VSL) is a pixel signal including a readout signal VSIG and a readout reset signal VRST sequentially read from a pixel (in this example, the photoelectric conversion reading part 211 and the signal holding part 212 of the pixel 21) in the global shutter mode read signal.

In the solid-state imaging device 10 according to the first embodiment, the column readout circuit 40 is formed so as to be shared by a single circuit configuration irrespective of the operation mode and the signal form of the readout signal (signals such as single-ended and differential).

Figure 5:
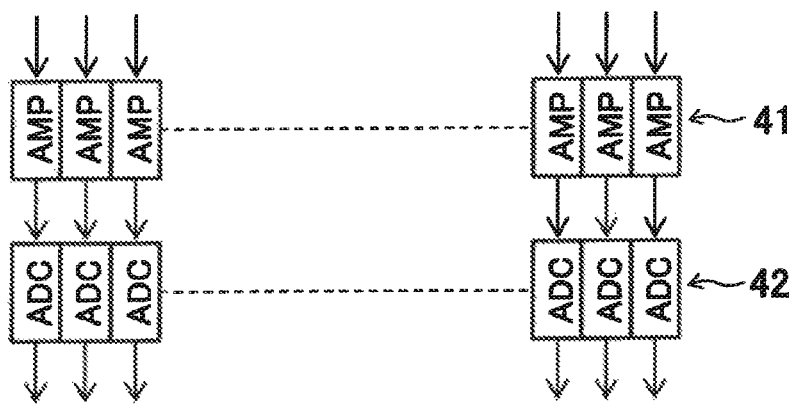
FIG. 5 is a view for explaining an example of the configuration of a read-out system of column output of the pixel portion in a solid-state imaging device according to an embodiment of the present invention.

The column readout circuit 40, for example as shown in FIG. 5, includes amplifiers (AMP) 41 and (analog-to-digital converters: AD converters) 42.

The horizontal scanning circuit 50 scans the signals processed in the plurality of column signal processing circuits such as the ADCs in the column readout circuit 40, transfers the results to the horizontal direction, and outputs the same to a not shown signal processing circuit.

The timing control circuit 60 generates timing signals which are necessary for the signal processing of the pixel portion 20, vertical scanning circuit 30, column readout circuit 40, horizontal scanning circuit 50, etc.

In the first embodiment, for example, at the time of the rolling shutter mode, the readout portion 70 makes the first pixel array 230 and holding part array 240 active to read out the differential pixel signal pixout.

Stacked Structure of Solid-State Imaging Device 10

Next, the stacked structure of the solid-state imaging device 10 according to the first embodiment will be explained.

Figure 6:
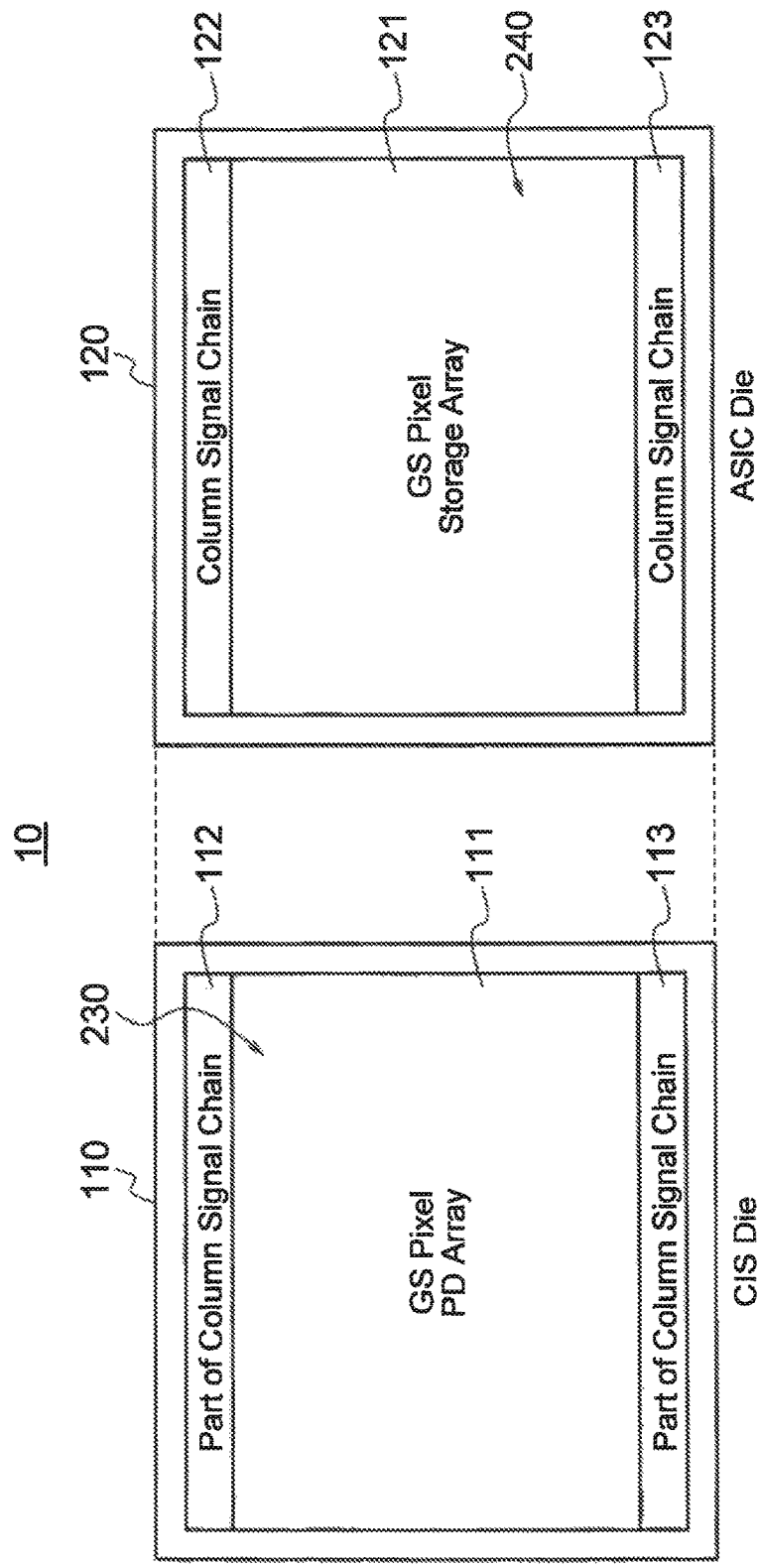
FIG. 6 is a view for explaining a stacked structure of the solid-state imaging device according to the first embodiment.

FIG. 6 is a diagram for explaining the stacked structure of the solid-state imaging device 10 according to the first embodiment.

The solid-state imaging device 10 according to the first embodiment has a stacked structure of a first substrate (upper substrate) 110 and a second substrate (lower substrate) 120. The solid-state imaging device 10 is for example formed as an imaging device of a stacked structure obtained by bonding two substrates at the wafer level and then cutting out the device by dicing. In the present example, it has a structure of the first substrate 110 stacked on the second substrate 120.

On the first substrate 110, the pixel array 230 (region 111) of the pixel portion 20 where the photoelectric conversion reading parts 211 of the pixels 21 are arranged is formed centered on its center part. Further, around the pixel array 23, in the example in FIG. 6, on the upper side and lower side in the drawing, regions 122 and 123 for a part of column readout circuits 40 are formed. Note that, the part of the column readout circuit 40 may be arranged on either of the upper side or lower side of the region 111 of the pixel array 230.

In this way, in the first embodiment, on the first substrate 110, the photoelectric conversion reading parts 211 of the pixels 21 are formed in a matrix.

On the second substrate 120, the holding part array 240 (region 121) where the signal holding parts 212 of the pixels 21 to be connected to the output nodes ND21 of the photoelectric conversion reading parts 211 of the pixel array 230 are arranged in a matrix and the first vertical signal line LSGN11 and the second vertical signal line LSGN12 are formed centered on its center part. The holding part array may be completely shielded from light by a metal wiring layer. Further, around the holding part array 240, in the example in FIG. 6, on the upper side and lower side in the drawing, regions 122 and 123 for column readout circuits 40 are formed. Note that, the column readout circuit 40 may be arranged on either of the upper side or lower side of the region 121 of the holding part array 240. Further, on the lateral side of the holding part array 240, a region for the vertical scanning circuit 30 and a region for a digital and/or output system may be formed. Further, on the second substrate 120, a vertical scanning circuit 30, horizontal scanning circuit 50, and timing control circuit 60 may also be formed.

In such a stacked structure, for example, as shown in FIG. 3, the output nodes ND21 of the photoelectric conversion reading parts 211 of the pixel array 230 on the first substrate 110 and the input nodes ND22 of the signal holding parts 212 of the pixels 21 on the second substrate 120 are electrically connected by using vias (die-to-die vias) or microbumps. Further, for example as shown in FIG. 3, the power supply line vddpix of the drain side the source-follower transistor SF1-Tr on the first substrate 110 and the output side of the power supply switching part 22 on the second substrate 120 are electrically connected by using vias (die-to-die vias) or microbumps.

Readout Operation of Solid-State Imaging Device 10

Above, the characterizing configurations and functions of the parts in the solid-state imaging device 10 were explained. Next, the readout operations etc. of the solid-state imaging device 10 according to the first embodiment will be explained in detail.

FIG. 7A to FIG. 7G are timing charts for mainly explaining a readout operation at the time of a predetermined shutter mode in the pixel portion of the solid-state imaging device according to the first embodiment.

Figure 7:
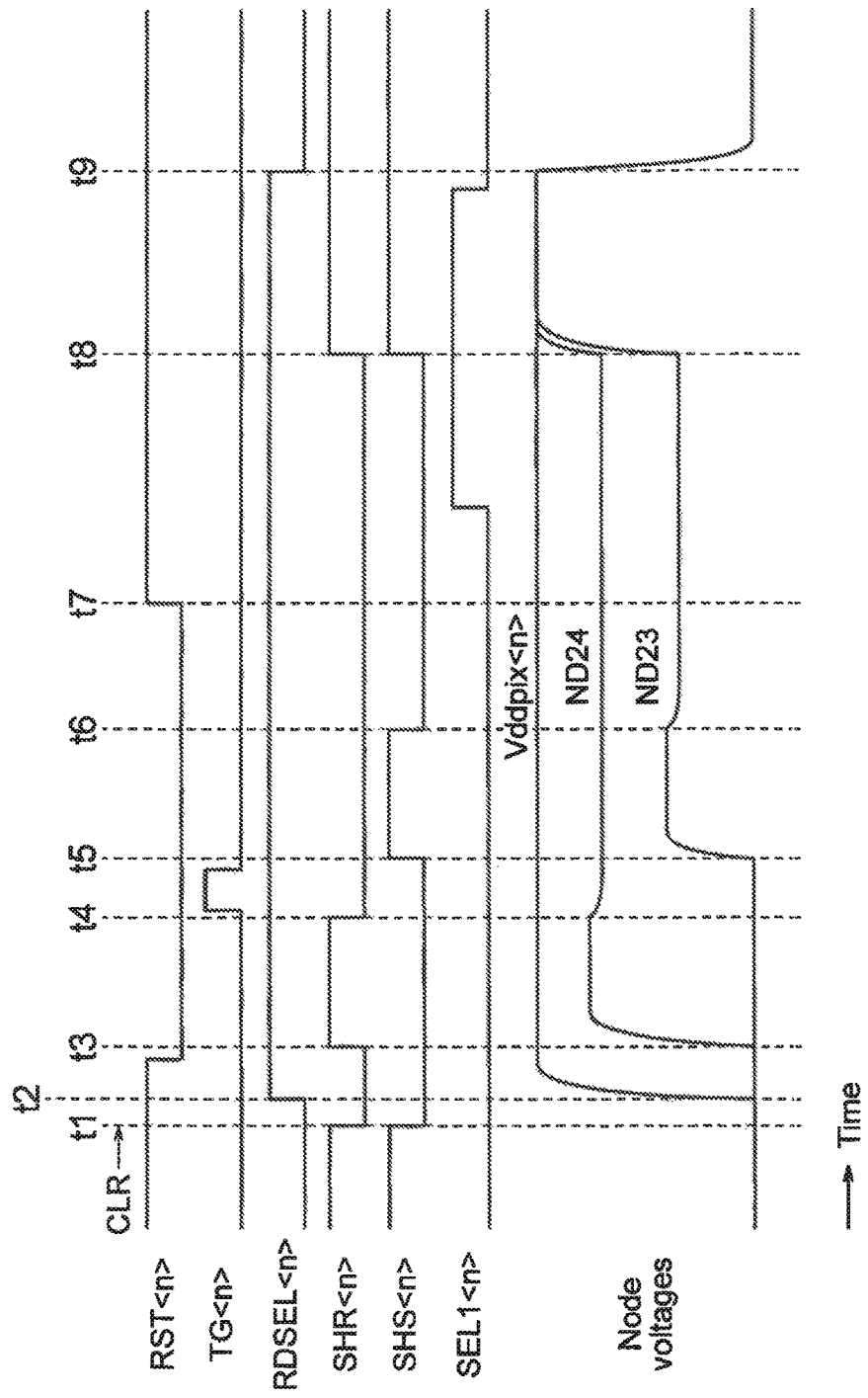
FIG. 7A to FIG. 7G are timing charts for mainly explaining a readout operation at the time of a predetermined shutter mode in the pixel portion of the solid-state imaging device according to the first embodiment.

FIG. 7A shows a control signal RST of reset transistor RST1-Tr of a photoelectric conversion reading part 211 of a pixel 21. FIG. 7B shows a control signal TG of transfer transistor RG1-Tr of a photoelectric conversion reading part 211 of a pixel 21. 7C shows a control signal RDSEL of a power supply switching part 22. 7D shows a control signal SHR of second sampling transistor SHR1-Tr a signal holding part 212 of a pixel 21. 7E shows a control signal SHD of first sampling transistor SHS1-Tr of a signal holding part 212 of a pixel 21. FIG. 7F shows a control signal SEL1 of selection transistors SEL1-Tr and SEL2-Tr of a signal holding part 212 of a pixel 21. 7G shows levels of nodes ND23 and ND24 of a signal holding part 21 of a pixel 21 and a power source potential.

In FIGS. 7A to 7G, the time until the time t1 is the clearing period CLR of the first signal holding capacitor CS21 and the second signal holding capacitor CR21 of the signal holding part 212. In the clearing period CLR, as shown in FIG. 7A, the reset transistor RST1-Tr of the photoelectric conversion reading part 211 of the pixel 21 is selected and becomes a conductive state in the period where the control signal RST is the H level, and the floating diffusion FD is reset to the potential of the power supply line Vdd. Then, as shown in FIG. 7C, the control signal RDSEL of the power source switching part 22 is set to the L level, and the power source line Vddpix on the drain side of the source-follower transistor SF1-Tr of the photoelectric conversion reading part 211 is in a state connected to the reference potential VSS. In this case, the gate of the source-follower transistor SF1-Tr gate (floating diffusion FD 21) is reset to the potential of the power supply line Vdd by the reset transistor RST1-Tr, so the source-follower transistor SF1-Tr functions merely as a switch.

Further, as shown in FIGS. 7D and 7E, the control signal SHR of the second sampling transistor SHR1-Tr and the control signal SHS of the first sampling transistor SHS1-Tr of the signal holding part 212 are set to the H level, while the first sampling transistor SHS1-Tr and the second sampling transistor SHR1-Tr are in a state of a conductive state. Due to this, the first signal holding capacitor CS21 and the second signal holding capacitor CR21 of the signal holding part 212 are cleared to 0V.

Both capacitors of the first signal holding capacitor CS21 and the second signal holding capacitor CR21 are cleared to 0V in the clearing period. When the capacitors are connected to the source-follower transistor SF1-Tr of the photoelectric conversion reading part 211, the electrons are provided by the first signal holding capacitor CS21 and the second signal holding capacitor CR21. Accordingly, the first signal holding capacitor CS21 and the second signal holding capacitor CR21 function as a dynamic current source.

Next, at the time t2, the control signal RDSEL of the power supply switching part 22 is switched to the H level, the power supply line Vddpix on the drain side of the source-follower transistor SF1-Tr of the photoelectric conversion reading part 211 becomes a state connected to the power supply line Vdd of the power supply potential VDD. As a result, the source-follower transistor SF1-Tr functions as a normal first source-follower element.

In such a state, in the reset period including the time t2, the reset transistor RST1-Tr is selected and becomes a conductive state in the period where the control signal RST is the H level. Further, in the period where the control signal RST is the H level, the floating diffusion FD21 is reset to the potential of the power supply line Vdd. In the photoelectric conversion reading part 211, the charge in the floating diffusion FD21 is converted to a voltage signal with a gain in accordance with the charge amount (potential) by the source-follower transistor SF1-Tr and is output as the readout reset signal VRST of column output from the output node ND21. Thereafter, the control signal RST of the reset transistor RST1-Tr is switched to the L level, and the reset transistor RST1-Tr becomes the non-conductive state. Then, in the signal holding unit 212, the control signal SHR is switched to the H level in a predetermined period including the time t3 whereby the second sampling transistor SHR1-Tr becomes the conduction state.

As a result, the readout reset signal VRST output from the output node ND21 of the photoelectric conversion reading part 211 is transmitted through the third signal line LSGN13 to the corresponding signal holding part 212 and is held in the signal holding capacitor CR21 through the second sampling transistor SHR1-Tr. However, the times t2 and t3 may be the same at the same time.

After holding the readout reset signal VRST in the second signal holding capacitor CR21, the control signal SHR is switched to the L level at the time t4 whereby the second sampling transistor SHR1-Tr becomes the non-conductive state.

Next, the predetermined period between times t4 and t5 becomes the transfer period. In the transfer period, the transfer transistor TG1-Tr is selected and becomes the conductive state in the period where the control signal TG is the H level in each photoelectric conversion reading part 211, so the charges (electrons) photoelectrically converted and stored in the photodiode PD21 are transferred to the floating diffusion FD 21. When the transfer period ends, the control signal TG of the transfer transistor TG1-Tr is switched to the L level whereby the transfer transistor TG1-Tr becomes the non-conductive state. In the photoelectric conversion reading part 211, the charge of the floating diffusion FD 21 is converted into a voltage signal with a gain in accordance with the charge amount (potential) by the source-follower transistor SF1-Tr and is output as a column output readout signal VSIG from the output node ND21.

Further, in the signal holding parts 212 of the holding part array 240, the following control is performed. In the signal holding parts 212, the control signal SHS is switched to the H level in the predetermined period including the time t5, and the first sampling transistor SHS1-Tr is controlled to be in the conductive state.

As a result, the readout signal VSIG output from the output node ND21 of the photoelectric conversion reading part 211 is transmitted through the third signal line LSGN13 to the corresponding signal holding part 212 and is held in the signal holding capacitor CS21 through the first sampling transistor SHS1-Tr.

After holding the readout signal VSIG in the first signal holding capacitor CS21, the control signal SHS is switched to the L level whereby the first sampling transistor SHS1-Tr becomes the non-conductive state.

In order to read out the signal held in this state, for selecting a certain row in the holding part array 240 in a predetermined period between the times t7 and t9, the control signal SEL1 of the selection transistors SEL1S-Tr and SEL2R-S in that the selected row is set to the H level whereby the selection transistors SEL1S-Tr and SEL2R-Tr become the conductive state. Then, reading of the readout signal VSIG held in the first signal holding capacitor CS21 and reading of the readout reset signal VRST held in the second signal holding capacitor CR21 are performed in parallel.

At this time, in each signal holding part 212, due to the source-follower transistor SF2S-Tr having the gate connected to the node ND23, the signal is output as the readout signal VSIG of column output to the first vertical line LSGN11 in accordance with the held voltage of the first signal holding capacitor CS21 connected to the node ND23 and is supplied the same to the column readout circuit 40. In parallel with this, in signal holding part 212, due to the source-follower transistor SF3R-Tr having the gate connected to the node ND24, the signal is output as the readout reset signal VRST of column output to the second vertical line LSGN12 in accordance with the held voltage of the second signal holding capacitor CR21 connected to the node ND24 and is supplied in the same way to the column readout circuit 40.

In the readout period between times t7 and t9, the control signal RST is switched to the H level, and the reset transistor RST1-Tr is held in the conductive state. Further, at the time t8, the control signal SHR of the second sampling transistor SHR1-Tr of the signal holding part 212 and the control signal SHS of the first sampling transistor SHS1-Tr are set to the H level, and the first sampling transistor SHS1-Tr and the second sampling transistor SHR1-Tr are held in the conductive state. Due to this, the CDS processing in the column readout circuit 40 is enabled, the offset of the source-follower element (source-follower amplifier) can be removed, and low frequency noise such as 1/f can be removed.

Further, in for example the column readout circuit 40 configuring a portion of the readout portion 70, the amplification processing and AD conversion processing are carried out with respect to the readout reset signal VRST and the readout signal VSIG of the pixel signal pixout supplied as the differential signal simultaneously in parallel, further the difference {VRST–VSIG} between the two signals is taken and CDS processing is performed.

As described above, according to the first embodiment, the solid-state imaging device 10 is configured as for example a stacked type COMS image sensor having a pixel portion 20 which includes a pixel array 230 in which photoelectric conversion reading parts 211 of a plurality of pixels 21 are arranged in a matrix and a holding part array 240 in which the signal holding parts 212 of the plurality of pixels 21 are arranged in a matrix. Further, in the voltage mode, it simultaneously samples the pixel signal in all of the pixels in the signal holding part serving as the pixel signal storage, reads out converted signals corresponding to the readout signals held in the first signal holding capacitor CS21 and second signal holding capacity CR21 to the first signal line LSGN11, reads out the converted signals corresponding to the readout reset signals simultaneously in parallel to the second signal line LSGN12, and supplies the same as a differential signal to the column readout circuit 40.

Therefore, according to the solid-state imaging device 10 of the first embodiment, sufficient parasitic light sensitivity according to the application can be realized, settling error can be suppressed, and pixel fixed pattern noise can be reduced.

More specifically, since the holding part array 240 is shielded by the metal wiring layer and further sampled in the voltage mode, the holding part array 240 is stored with an increased number of electrons compared with the photo signal charge of the PD and as a result the parasitic light sensitivity (PLS) can be reduced. Further, it is possible to prevent the reduction of the gain in the sampling circuit, specifically, it is possible to increase the S/N ratio of the dark (shadow) portions as compared with the conventional configuration in which the gain is 0.5. It is possible to achieve a high image quality. In addition, the number of transistors can be reduced from the conventionally required eight transistors to six so reduction of size can be achieved. Since the constant current source for driving the source-follower transistor of each pixel is eliminated and the transistor can be dynamically driven by the sampling capacitance, a reduction in size and reduction in power consumption can be achieved. Even in the case of driving it dynamically, it is possible to suppress the occurrence of the pixel fixed pattern noise due to the settling error, which in turn makes it possible to achieve a high image quality. In addition, it is possible to reset the sampling capacitance via the source-follower transistor of the pixel, so reduction of size can be achieved. Further, a correlated double sampling (CDS) operation at the time of reading can be performed via the source-follower transistor of the pixel, so further reduction of size and higher image quality can be achieved. It is possible to use a high-performance backside illumination type 4-Tr APS configuration capable of obtaining a large number of saturated electrons with conventional high sensitivity without lowering the PLS characteristics. Further, by transferring from the pixel in the charge mode, the PD area in the pixel can be maximized, the quantization efficiency can be increased, and in turn, higher sensitivity can be achieved. Moreover, by performing differential output in the column readout circuit, it is possible to invalidate the common mode noise from the ground and the power supply.

Further, according to the solid-state imaging device 10 of the first embodiment, complication of the configuration is prevented, while a drop of the area efficiency in layout can be prevented.

Further, the solid-state imaging device 10 according to the first embodiment has a stacked structure of a first substrate (upper substrate) 110 and a second substrate (lower substrate) 120. Accordingly, in the first embodiment, by basically forming the first substrate 110 side by only NMOS elements and expanding the valid pixel region up to the maximum limit by the pixels in the pixel array, the cost performance can be raised to the maximum.

Second Embodiment

Figure 8:
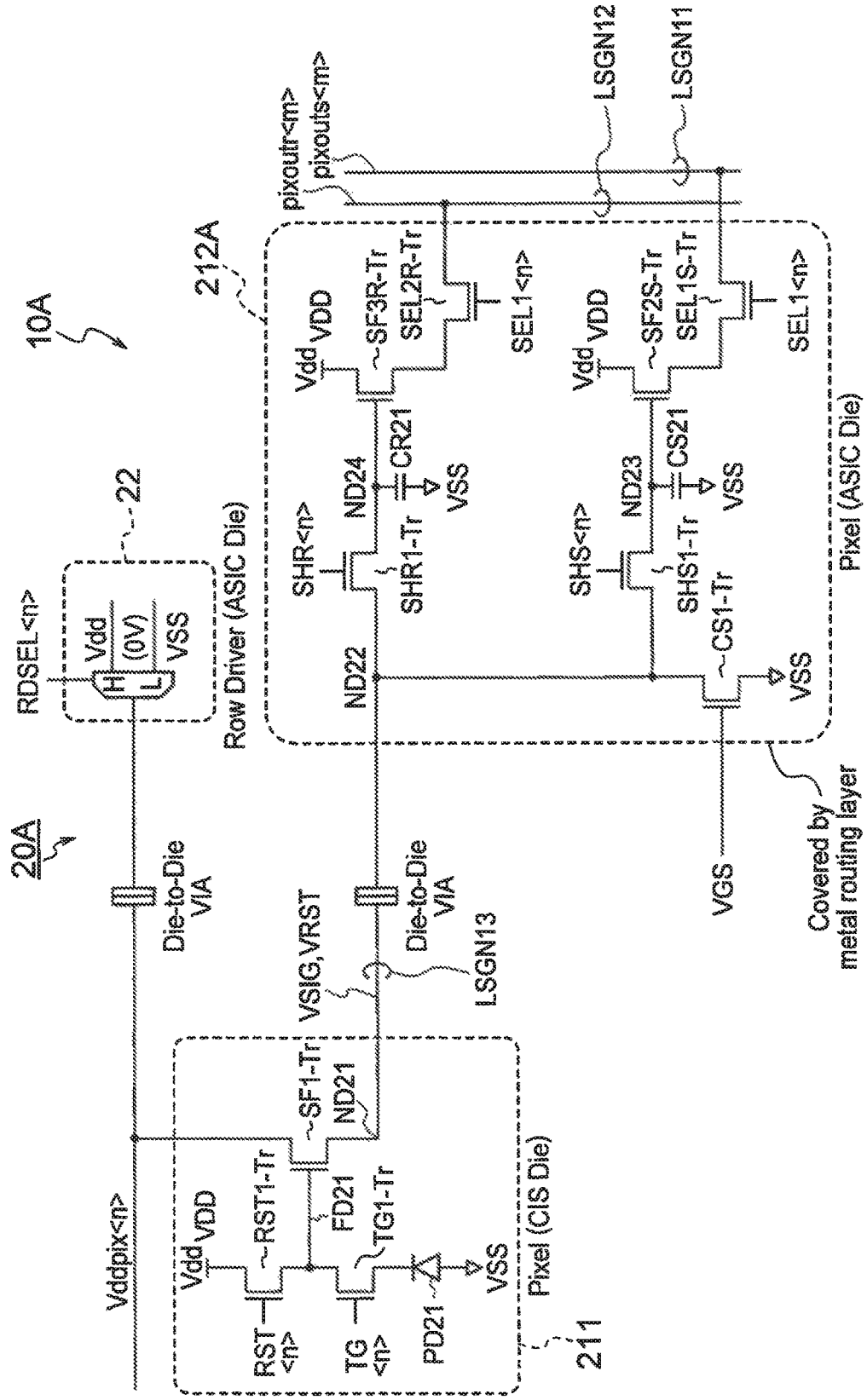
FIG. 8 is a view showing an example of the configuration of a pixel of a solid-state imaging device according to a second embodiment of the present invention.

FIG. 8 is a view showing an example of the configuration of a solid-state imaging device according to a second embodiment of the present invention.

The difference of the solid-state imaging device 10A according to the second embodiment from the solid-state imaging device 10 according to the above-described first embodiment is as follows. In the solid-state imaging device 10 A according to the second embodiment, a current source transistor CS1-Tr functioning as a constant current source is connected between the input node ND22 and the reference potential VSS in the signal holding part 212A. A control signal constituted by a bias signal VGS is supplied to a gate of the current source transistor CS1-Tr.

The bias signal VGS is supplied at a predetermined level when the current source transistor CS1-Tr is caused to function as a constant current source and supplied at the L level (0V) when not caused to function (not used) as a constant current source.

According to the second embodiment, the same effect as that of the above-described first embodiment can be obtained.

Third Embodiment

Figure 9:
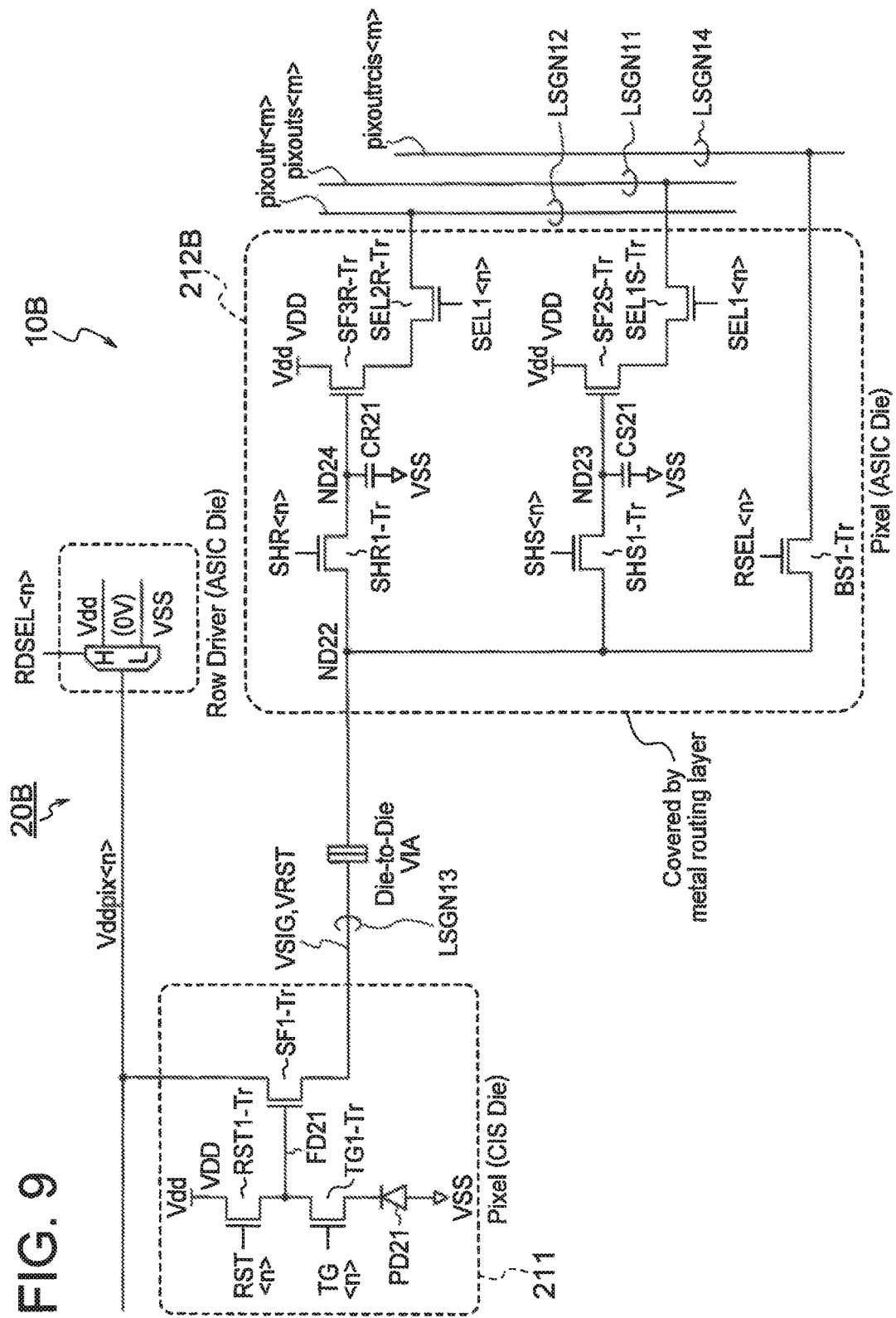
FIG. 9 is a view showing an example of the configuration of a pixel of a solid-state imaging device according to a third embodiment of the present invention.

FIG. 9 is a view showing an example of the configuration of a pixel of a solid-state imaging device according to a third embodiment of the present invention.

The difference of the solid-state imaging device 10B according to the third embodiment from the solid-state imaging device 10 according to the above-described first embodiment is as follows. In the solid-state imaging device 10B according to the third embodiment, in addition to the first vertical signal line LSGN11 and the second vertical signal line LSGN12, a fourth vertical signal line (another signal line) LSGN14 is arranged. In the signal holding part 212B, a bypass transistor BS1-Tr functioning as a bypass switch part is connected between the input node ND22 and the fourth vertical signal line LSGN14. A control signal RSEL is supplied to a gate of the bypass transistor BS1-Tr.

The control signal RSEL is supplied at a predetermined level when the read pixel signal is transferred to the fourth vertical signal line LSGN14 by bypassing the global shutter mode function of the signal holding part 212B in the rolling shutter mode and is supplied at the L level (0V) in the global shutter mode.

Note that, the bypass transistor BS1-Tr may be arranged so that the bypass transistor BS1-Tr is not connected between the input node ND22 and the newly provided fourth vertical signal line LSGN14 but is connected between the input node ND22 and the first vertical signal line LSGN11 or the second vertical signal line LSGN12.

According to the third embodiment, the same effect as that of the above-described first embodiment can be obtained.

Fourth Embodiment

Figure 10:
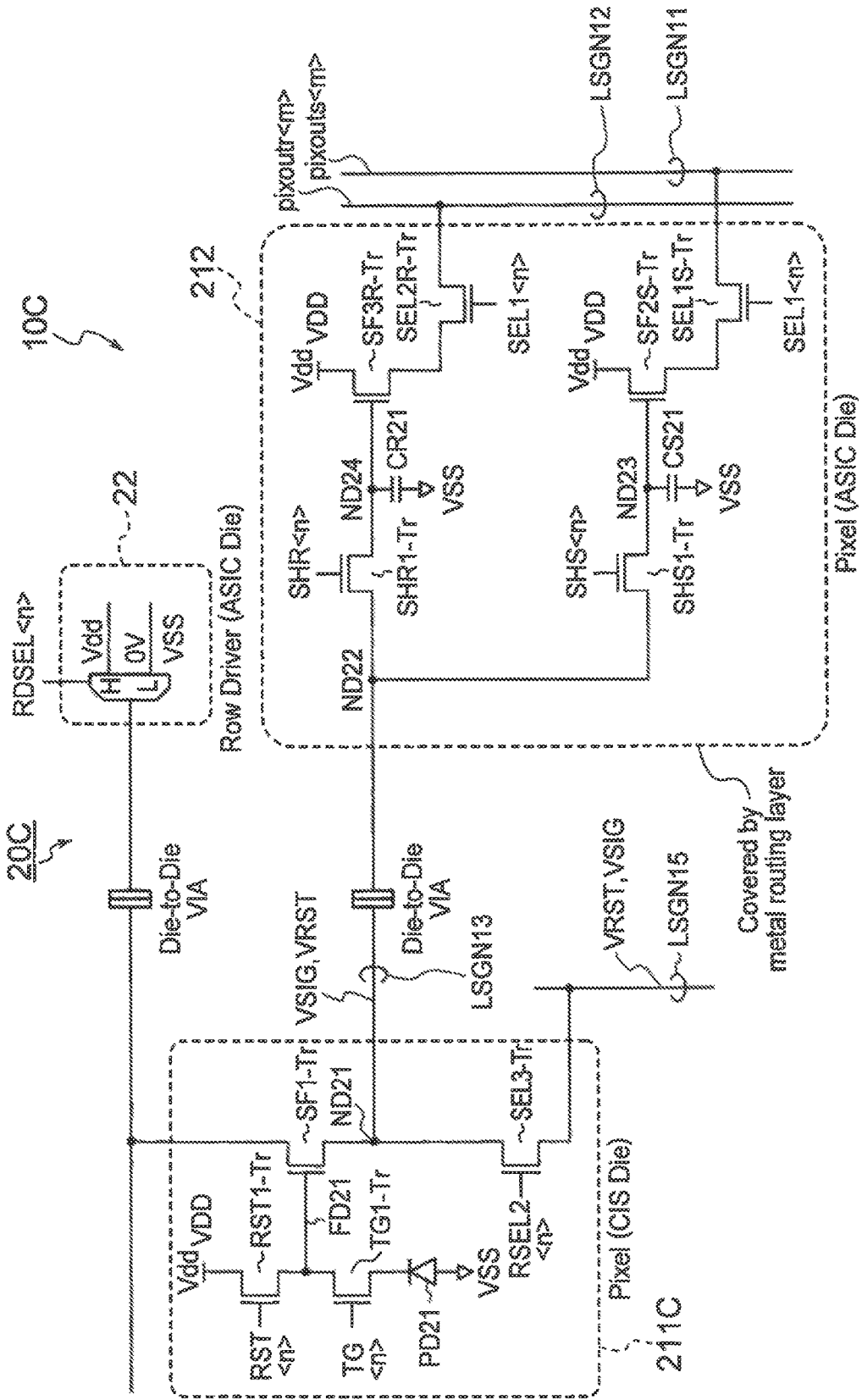
FIG. 10 is a view showing an example of the configuration of a pixel of a solid-state imaging device according to a fourth embodiment of the present invention.
Figure 11:
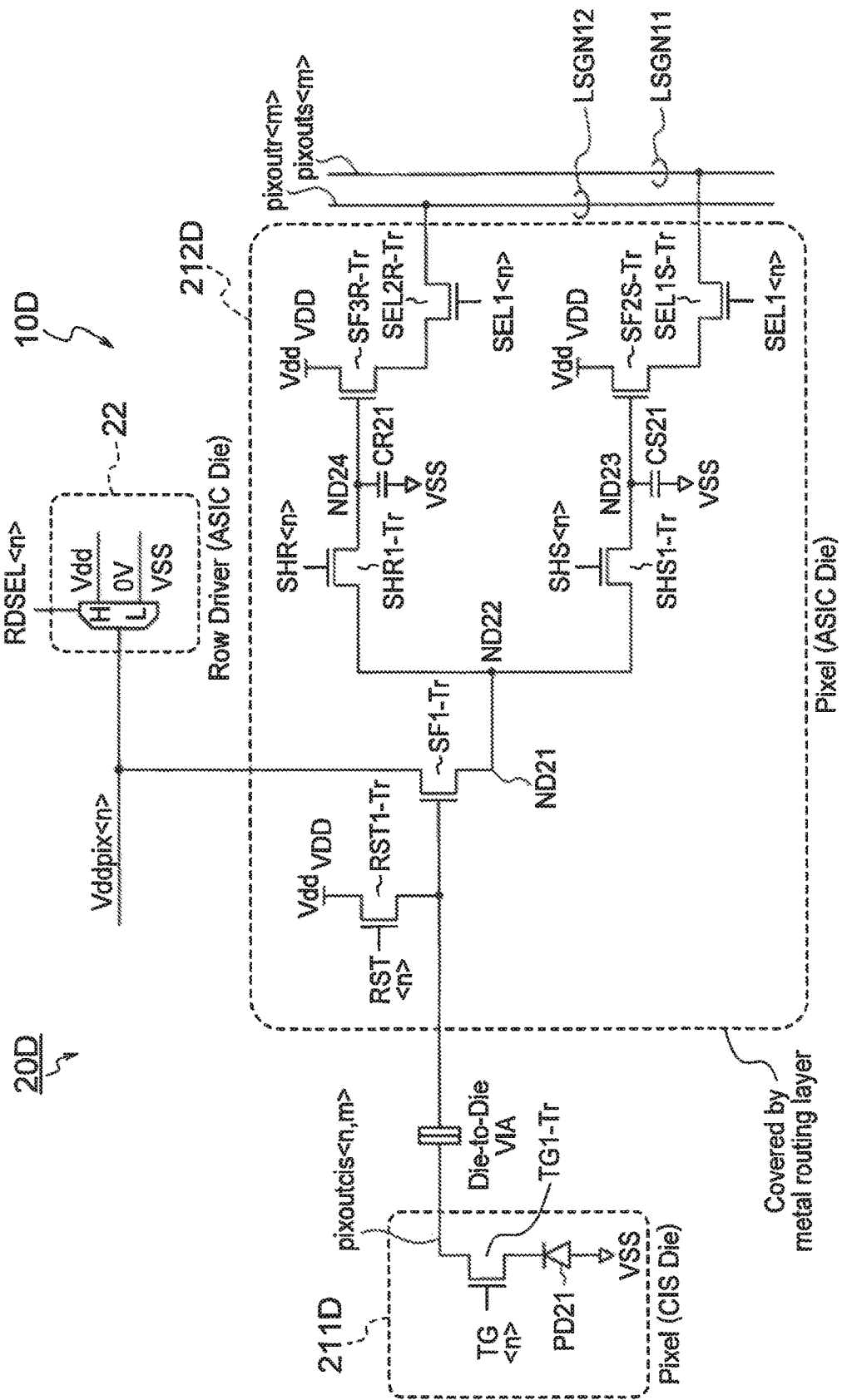
FIG. 11 is a view showing an example of the configuration of a pixel of a solid-state imaging device according to a fifth embodiment of the present invention.

FIG. 10 is a view showing an example of the configuration of a pixel of a solid-state imaging device according to a fourth embodiment of the present invention.

The difference of the solid-state imaging device 10C according to the fourth embodiment from the solid-state imaging devices 10, 10A, and 10B according to the above-described first, second, and third embodiments is as follows. In the solid-state imaging device 10C according to the fourth embodiment, the fifth vertical signal line LSGN15 is arranged on the photoelectric conversion reading part 211C side (first substrate 110) of the pixel 21, while in the photoelectric conversion reading part 211C, a selection transistor SEL3-Tr functioning as a selection element is connected between the ND21 and the fifth vertical signal line LSGN15. The control signal RSEL2 is supplied to a gate of the selection transistor SEL3-Tr.

The control signal RSEL2 is supplied at a predetermined level when the read pixel signal is transferred to the fifth vertical signal line LSGN15 in the rolling shutter mode and is supplied at the L level (0V) in the global shutter mode.

According to the fourth embodiment, the same effect as that of the above-described first embodiment can be obtained.

Fifth Embodiment

Figure 12:
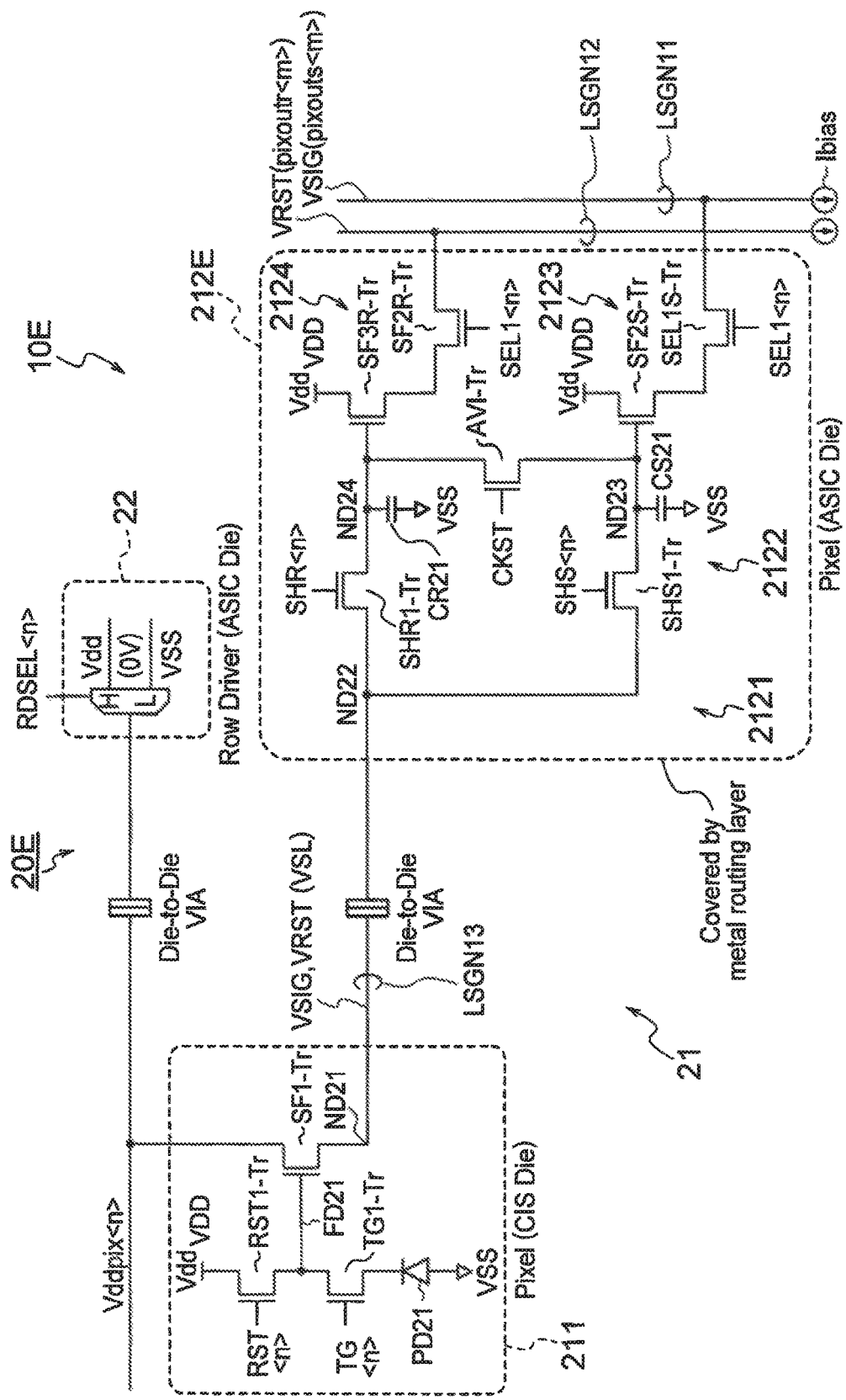
FIG. 12 is a view showing an example of the configuration of a pixel of a solid-state imaging device according to a sixth embodiment of the present invention.

FIG. 12 is a view showing an example of the configuration of a pixel of a solid-state imaging device according to a fifth embodiment of the present invention.

The difference of the solid-state imaging device 10D according to the fifth embodiment from the solid-state imaging devices 10, 10A, 10B, and 10C according to the above-described first, second, third, and fourth embodiments is as follows. In the solid-state imaging device 10D according to the fifth embodiment, the reset transistor RST1-Tr and the first source-follower element comprised of the source-follower transistor SF1-Tr of the photoelectric conversion reading unit 211 of the pixel are arranged not on the first substrate 110 side but on the signal holding part 212D side and are formed on the second substrate 120. Accordingly, on the first substrate 110, only the photodiode PD21 and the transfer transistor TG1-Tr are arranged.

According to the fifth embodiment, the same effect as that of the above-described first embodiment can be obtained of course. Also, since only one transistor is formed on the first substrate 110, a higher quantization efficiency can be realized.

Sixth Embodiment

FIG. 12 is a view showing an example of the configuration of a pixel of a solid-state imaging device according to a sixth embodiment of the present invention.

The difference of the solid-state imaging device 10E according to the sixth embodiment from the solid-state imaging devices 10, 10A, 10B, 10C, and 10D according to the above-described first, second, third, fourth, and fifth embodiments is as follows. In the solid-state imaging device 10E according to the sixth embodiment, an averaging part constituted by an averaging transistor AV1-Tr is connected between the holding node ND23 and the holding node ND24. A control signal CKST is supplied to a gate of the averaging part constituted by the averaging transistor AV1-Tr.

The reading of the read signal VSIG held in the first signal holding capacitor CS21 and differential reading of the read reset signal VRST held in the second signal holding capacitor CR21 are performed in parallel. After that, the control signal CKST is supplied at the H level. After that, the differential readout of the averaged signal is performed in parallel.

Readout Operation in Differential Global Shutter Mode

Next, a readout operation in the differential global shutter mode in the solid-state imaging device 10E according to the sixth embodiment will be explained. FIG. 13A to FIG. 13G are timing charts for mainly explaining a readout operation at the time of a global shutter mode of the pixel portion of the solid-state imaging device according to the sixth embodiment.

Figure 13:
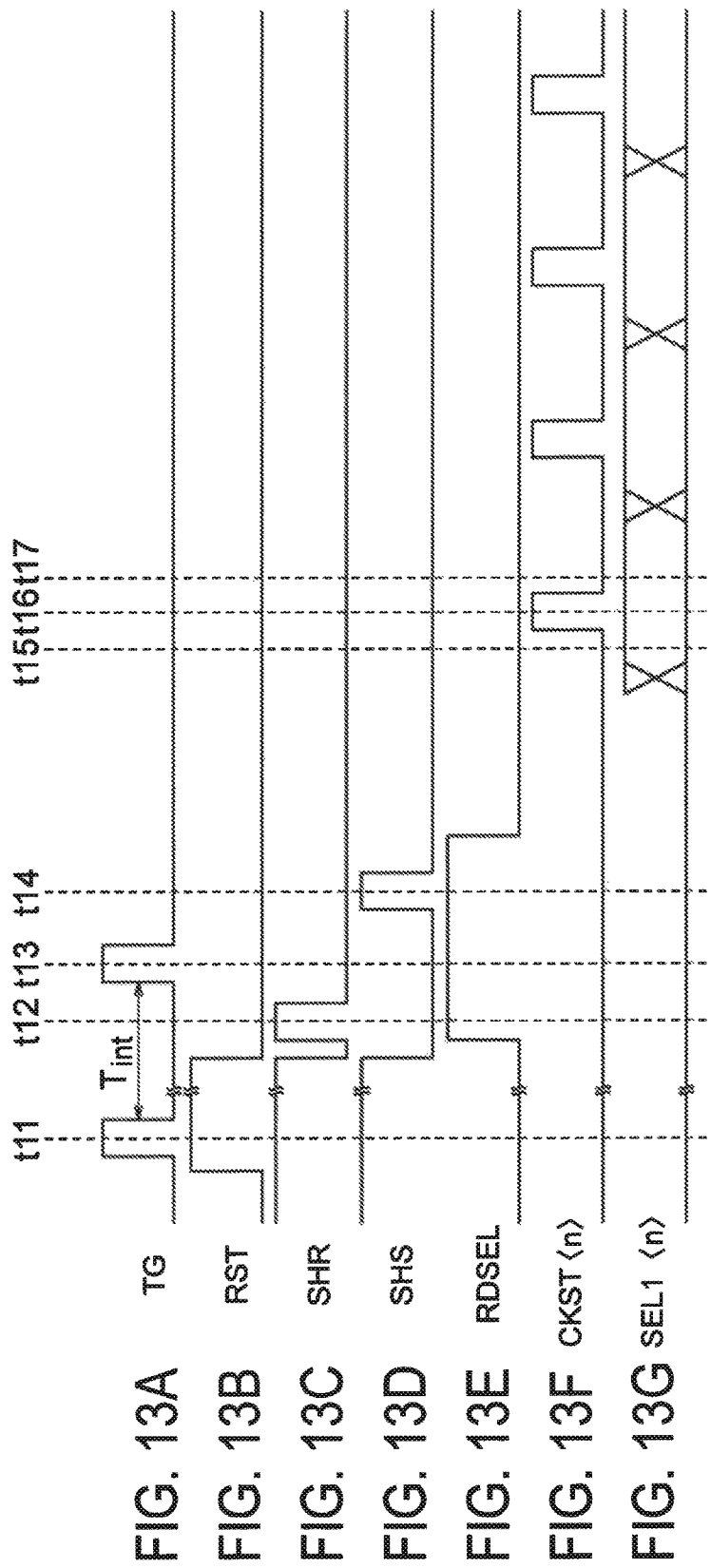
FIG. 13A to FIG. 13G are timing charts for mainly explaining a readout operation at the time of a global shutter mode of the pixel portion of the solid-state imaging device according to the sixth embodiment.

FIG. 13A shows the control signal TG of the transfer transistor TG1-Tr of the photoelectric conversion reading part 211 of the pixel 21. FIG. 13B shows the control signal RST of the reset transistor RST1-Tr of the photoelectric conversion reading part 211 of the pixel 21. FIG. 13C shows the control signal SHR of the second sampling transistor SHR 1-Tr of the signal holding part 212E of the pixel 21. FIG. 13D shows the control signal SHS of the first sampling transistor SHS1-Tr of the signal holding part 212E of the pixel 21. FIG. 13E shows the control signal RDSEL of the power supply switching part 22. FIG. 13F shows the control signal CKST of the averaging transistor AV1-Tr in the signal holding part 212E of the pixel 21. FIG. 13G shows the control signal SEL1 of the selection transistors SEL1S-Tr and SEL2R-Tr of the signal holding part 212E of the pixel 21. Note that, the control signal RDSEL of the power supply switching unit 22 is operated (switched) in parallel simultaneously in all rows.

In the global shutter mode, the pixel array 230 is in an active state and is ready to output a voltage signal from the output node ND21 to the signal holding part 212E.

In FIG. 13A to FIG. 13G, a period between the time t11 and t12 is the reset period and the storage period Tint of charge of the photodiode PD21 and the floating diffusion FD21 in all of the photoelectric conversion reading part 211 of the pixel array 230.

Note that, in this reset period, the control signals SHS and SHR of the first sampling transistor SHS1-Tr and the second sampling transistor SHR1-Tr which control the driving of all the signal holding parts 212E of the holding portion array 240 are set to the H Level, and the first sampling transistor SHS1-Tr and the second sampling transistor SHR1-Tr are controlled to be a conductive state. On the other hand, the control signal CKST of the averaging transistor AV1-Tr and the control signal SEL1 for controlling the selection transistors SEL1S-Tr and SEL2R-Tr are set to the L level, and the averaging transistor AV1-Tr and the selection transistors SEL1S-Tr and SEL2R-Tr are controlled to a non-conductive state. Further, the control signal RDSEL for controlling the power supply switching part 22 is set to the L level, and the power supply line Vddpix is connected to the reference potential VSS by the power supply switching part 22.

In such a state, in the reset period, the reset transistor RST1-Tr is selected and becomes the conductive state in the period where the control signal RST is the H level. Further, in the period where the control signal RST is the H level, the transfer transistor TG1-Tr is selected and becomes the conductive state in the period where the control signal TG is the H level, the storage node of the charge (electron) photoelectrically converted and stored in the photodiode PD21 becomes conductive with the floating diffusion FD21, and the photodiode PD 21 and the floating diffusion FD 21 are reset to the potential of the power supply line Vdd.

After resetting the photodiode PD21, the control signal TG of the transfer transistor TG1-Tr is switched to the L level, the transfer transistor TG1-Tr becomes a non-conductive state, and storage of photoelectrically converted charges is started in the photodiode PD21.

At this time, the control signal RST of the reset transistor RST1-Tr is held at the H level, and the floating diffusion FD 21 is held in the state reset to the potential of the power supply line Vdd. Further, for the end of the reset period, the control signal RST of the reset transistor RST1-Tr is switched to the L level whereby the reset transistor RST1-Tr becomes the non-conductive state.

In the photoelectric conversion reading part 211, simultaneously with the control of switching the control signal RST of the reset transistor RST1-Tr to the L level, in the signal holding part 212E, the control signals SHS and SHR of the first sampling transistor SHS1-Tr and the second sampling transistor SHR1-Tr are switched to the L level. Further, after the reset period ends, the following control is performed in the power source switching part 22 and all the signal holding parts 212E of the holding part array 240. After the control signals SHS and SHR of the first sampling transistor SHS1-Tr and the second sampling transistor SHR1-Tr are switched to the L level, the control signal RDSEL is switched to the H level in the power source switching part 22, and the power source line Vddpix is connected to the power supply line Vdd of the power supply potential VDD. Further, in the signal holding part 212E, the control signal SHR is switched to the H level in the predetermined period including the time t12 whereby the second sampling transistor SHR1-Tr is controlled to be in the conductive state.

As a result, at the time t12, the readout reset signal VRST output from the output node ND21 of the photoelectric conversion reading part 211E is transmitted through the third signal line LSGN13 to the corresponding signal holding part 212E and is held in the signal holding capacitor CR21 through the second sampling transistor SHR1-Tr.

After holding the readout reset signal VRST in the second signal holding capacitor CR21, the control signal SHR is switched to the L level whereby the second sampling transistor SHR1-Tr becomes the non-conductive state.

Here, the predetermined period including the time t13 becomes the transfer period. In the transfer period, the transfer transistor TG1-Tr is selected and becomes the conductive state in the period where the control signal TG is the H level in each photoelectric conversion reading part 211, so the charges (electrons) photoelectrically converted and stored in the photodiode PD21 are transferred to the floating diffusion FD 21. When the transfer period ends, the control signal TG of the transfer transistor TG1-Tr is switched to the L level whereby the transfer transistor TG1-Tr becomes the non-conductive state.

Further, in the signal holding parts 212E of the holding part array 240, the following control is performed. In the signal holding parts 212E, the control signal SHS is switched to the H level in the predetermined period including the time t14, and the first sampling transistor SHS1-Tr is controlled to be in the conductive state.

As a result, at the time t14, the readout signal VSIG output from the output node ND21 of the photoelectric conversion reading part 211 is transmitted through the third signal line LSGN13 to the corresponding signal holding part 212E and is held in the signal holding capacitor CS21 through the first sampling transistor SHS1-Tr.

After holding the readout signal VSIG in the first signal holding capacitor CS21, the control signal SHS is switched to the L level whereby the first sampling transistor SHS1-Tr becomes the non-conductive state.

Thereafter, in the power source switching part 22, the control signal RDSEL is switched to the L level, and the power source line Vddpix is connected to the reference potential VSS.

In order to read out the signal held in this state, for selecting a certain row in the holding part array 240, the control signal SEL1 of the selection transistors SEL1S-Tr and SEL2R-S in that the selected row is set to the H level whereby the selection transistors SEL1S-Tr and SEL2R-Tr become the conductive state. Further, at the time t15, reading of the readout signal VSIG held in the first signal holding capacitor CS21 and reading of the readout reset signal VRST held in the second signal holding capacitor CR21 are performed in parallel.

At this time, in each signal holding part 212, due to the source-follower transistor SF2S-Tr having the gate connected to the node ND23, the signal is output as the readout signal VSIG of column output to the first vertical line LSGN11 in accordance with the held voltage of the first signal holding capacitor CS21 connected to the node ND23 and is supplied to the column readout circuit 40. In parallel with this, in each signal holding part 212, due to the source-follower transistor SF3R-Tr having the gate connected to the node ND24, the signal is output as the readout reset signal VRST of column output to the second vertical line LSGN12 in accordance with the held voltage of the second signal holding capacitor CR21 connected to the node ND24 and is supplied to the column readout circuit 40 as a differential signal.

Next, in the signal holding part 212E, the control signal CKST is switched to the H level in a predetermined period including the time t16, and the averaging transistor AV1-Tr becomes the conductive state.

Further, at the time t17, the readout signal VSIG held in the first signal holding capacitor CS21 and the readout reset signal VRST held in the second signal holding capacitor CR21 are averaged, and reading of the averaged signals are performed in parallel.

At this time, in each signal holding part 212, due to the source-follower transistor SF2S-Tr having the gate connected to the node ND23, the signal is output as the averaged signal of column output to the first vertical line LSGN11 in accordance with the averaged voltage of the node ND23 and is supplied to the column readout circuit 40. In parallel with this, in each signal holding part 212, due to the source-follower transistor SF3R-Tr having the gate connected to the node ND24, the signal is output as the averaged signal of column output to the second vertical line LSGN12 in accordance with the averaged voltage of the node ND24 and is supplied to the column readout circuit 40 as a differential signal.

Here, assuming that the offsets of the source-follower transistors SF2S-Tr and SF3R-Tr outputting the signal level VS and the reset level VR read from the signal holding part 212E are VOS1 and VOS2, respectively, the following relations are obtained.

$$V_{OUTR}(t15) - V_{OUTS}(t15) = V_R + V_{OS2} - (V_S + V_{OS1})$$

$$V_{OUTR}(t17) - V_{OUTS}(t17) = (V_R + V_S)/2 + V_{OS2} - ((V_R + V_S)/2 + V_{OS1})$$

$$V_{OUTR}(t15) - V_{OUTS}(t15) - \{V_{OUTR}(t17) - V_{OUTS}(t17)\} = V_R - V_S$$

where, $V_{OUTR}(t15)$ represents the reset signal voltage read out at the time t15, $V_{OUTS}(t15)$ represents the signal voltage read out at the time t15, $V_{OUTR}(t17)$ represents the reset signal voltage read out at the time t17, and $V_{OUTS}(t17)$ represents the signal voltage read out at the time t17.

From the above, it is possible to eliminate offset of the source-follower transistors SF2S-Tr and SF3R-Tr by subjecting the differential signal to CDS processing in a later circuit.

For example, in the column readout circuit 40 forming a part of the readout portion 70, the readout signal VSIG and the readout reset signal VRST read out simultaneously in parallel at the time t15 and the averaged signal AVSR read out at the time t17 are supplied in parallel as the second pixel signal pixout2.

For example, in the column readout circuit 40 forming a part of the readout portion 70, amplification processing and AD conversion processing are carried out with respect to the readout reset signal VRST, the readout signal VSIG, and the averaged signal AVSR. Further, the difference {VRST−VSIG−AVSR} among the signals is taken and CDS processing is performed.

The solid-state imaging devices 10 and 10A to 10E explained above can be applied as imaging devices to a digital camera or video camera, portable terminal, monitoring camera, camera for medical endoscope, or other electronic apparatus.

Figure 14:
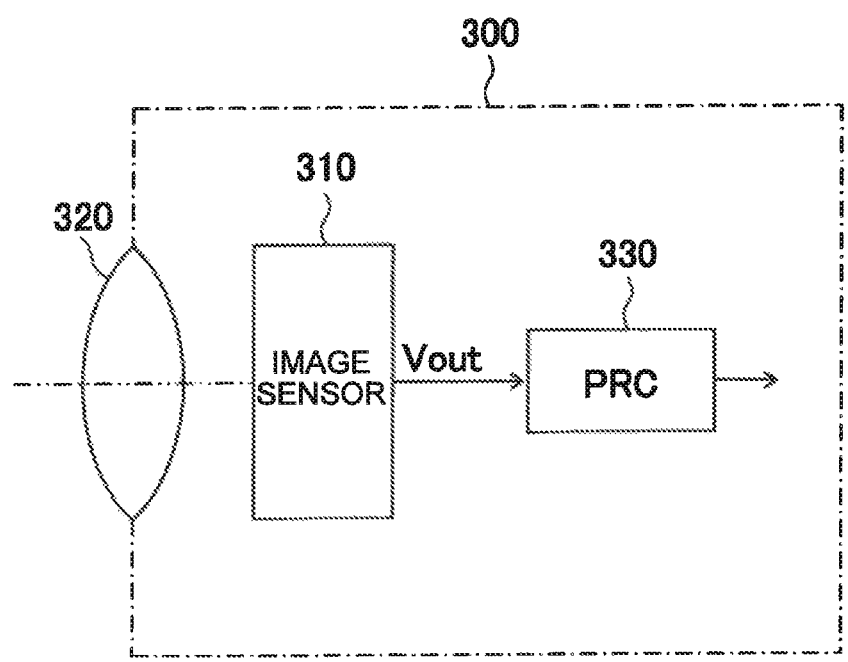
FIG. 14 is a view showing an example of the configuration of an electronic apparatus to which a solid-state imaging device according to an embodiment of the present invention is applied.

FIG. 14 is a view showing an example of the configuration of an electronic apparatus mounting a camera system to which the solid-state imaging device according to an embodiment of the present invention is applied.

The present electronic apparatus 300, as shown in FIG. 14, has a CMOS image sensor 310 to which the solid-state imaging devices 10 and 10A to 10E according to the present embodiment can be applied. Further, the electronic apparatus 300 has an optical system (lens etc.) 320 for guiding incident light (forming a subject image) into the pixel region of this CMOS image sensor 310. The electronic apparatus 300 has a signal processing circuit (PRC) 330 for processing the output signal of the CMOS image sensor 310.

The signal processing circuit 330 applies predetermined signal processing to the output signal of the CMOS image sensor 310. The image signal processed in the signal processing circuit 330 can be projected as a moving picture on a monitor configured by a liquid crystal display or the like or can be output to a printer. Further, it may be directly recorded in a memory card or other storage media. Various aspects are possible.

As explained above, by mounting the solid-state imaging devices 10 and 10A to 10E explained before as the CMOS image sensor 310, it becomes possible to provide a high performance, small-size, and low cost camera system. Further, electronic apparatuses used for applications with restrictions due to the requirements of installation of cameras such as mounting size, number of connectable cables, cable lengths, and installation heights such as monitoring cameras, cameras for medical endoscopes, etc. can be realized.

The invention claimed is:

1. A solid-state imaging device comprising:
  a pixel portion in which pixels, each pixel including a photoelectric conversion reading part and a signal holding part, are arranged,
  a readout portion for reading pixel signals from the pixel portion, and
  a first signal line and a second signal line to which held signals of the signal holding part are output, wherein
  a pixel signal read out from a pixel is a pixel signal including at least a readout signal and a readout reset signal,
  the photoelectric conversion reading part of the pixel includes at least
  an output node,
  a photoelectric conversion element which stores a charge generated by photoelectric conversion in a storage period,
  a transfer element capable of transferring the charge stored in the photoelectric conversion element in a transfer period,
  a floating diffusion to which a charge stored in the photoelectric conversion element is transferred through the transfer element,
  a first source-follower element which converts the charge of the floating diffusion to a voltage signal corresponding to the charge amount and outputs the converted signal to the output node, and
  a reset element which resets the floating diffusion to a predetermined potential in a reset period, and
  the signal holding part includes
  an input node,
  a first signal holding capacitor capable of holding a readout signal output from the output node of the photoelectric conversion reading part of the pixel and input to the input node,
  a second signal holding capacitor capable of holding a readout reset signal output from the output node of the photoelectric conversion reading part of the pixel and input to the input node,
  a first switch element which selectively connects the first signal holding capacitor with the output node of the photoelectric conversion reading part,
  a second switch element which selectively connects the second signal holding capacitor with the output node of the photoelectric conversion reading part,
  a first output part including a second source-follower element which outputs a signal held in the first signal holding capacitor in accordance with a held voltage and selectively outputting the converted signal to the first signal line, and a second output part including a third source-follower element which outputs a signal held in the second signal holding capacitor in accordance with a held voltage and selectively outputting the converted signal to the second signal line, wherein a drain side of the first source-follower element of the photoelectric conversion reading part can be selectively connected to a power supply potential or a reference potential.

2. The solid-state imaging device as set forth in claim 1, wherein when clearing the first signal holding capacitor and the second signal holding capacitor of the signal holding part, the readout portion connects a drain side of the first source-follower element to a reference potential, resets the floating diffusion to a predetermined potential by the reset element to make the first source-follower element function as a switch, and holds the first switch element and the second switch element of the signal holding part in a conductive state.

3. The solid-state imaging device as set forth in claim 1, wherein the readout portion when reading a pixel signal of a pixel, connects a drain side of the first source-follower element to a power supply potential, when reading a readout signal as a pixel signal from a pixel, makes the first switch element of the signal holding part conductive for a predetermined period and holds the readout signal in the first signal holding capacitor, when reading a readout reset signal as a pixel signal from a pixel, makes the second switch element of the signal holding part conductive for another predetermined period and holds the readout reset signal in the second signal holding capacitor, and in a state in which the first switch element and the second switch element are held in a nonconductive state, reads out the converted signal corresponding to the readout signal to the first signal line by the first output part and reads out the converted signal corresponding to the readout reset signal simultaneously in parallel to the second signal line by the second output part.

4. A solid-state imaging device comprising:

a pixel portion in which pixels, each pixel including a photoelectric conversion reading part and a signal holding part, are arranged, a readout portion for reading pixel signals from the pixel portion, and a first signal line and a second signal line to which held signals of the signal holding part are output, wherein a pixel signal read out from a pixel is a pixel signal including at least a readout signal and a readout reset signal, the photoelectric conversion reading part of the pixel includes at least an output node, a photoelectric conversion element which stores a charge generated by photoelectric conversion in a storage period, a transfer element capable of transferring the charge stored in the photoelectric conversion element in a transfer period, a floating diffusion to which a charge stored in the photoelectric conversion element is transferred through the transfer element, a first source-follower element which converts the charge of the floating diffusion to a voltage signal corresponding to the charge amount and outputs the converted signal to the output node, and a reset element which resets the floating diffusion to a predetermined potential in a reset period, and the signal holding part includes an input node, a first signal holding capacitor capable of holding a readout signal output from the output node of the photoelectric conversion reading part of the pixel and input to the input node, a second signal holding capacitor capable of holding a readout reset signal output from the output node of the photoelectric conversion reading part of the pixel and input to the input node, a first switch element which selectively connects the first signal holding capacitor with the output node of the photoelectric conversion reading part, a second switch element which selectively connects the second signal holding capacitor with the output node of the photoelectric conversion reading part, a first output part including a second source-follower element which outputs a signal held in the first signal holding capacitor in accordance with a held voltage and selectively outputting the converted signal to the first signal line, and a second output part including a third source-follower element which outputs a signal held in the second signal holding capacitor in accordance with a held voltage and selectively outputting the converted signal to the second signal line, wherein the device has a stacked structure which includes a first substrate and a second substrate, the first substrate and the second substrate are connected through a connection part, the first substrate is formed with at least a portion of the photoelectric conversion reading parts of the pixels, and the second substrate is formed with at least the signal holding parts, the first signal line, the second signal line, and at least a portion of the readout portion.

5. The solid-state imaging device as set forth in claim 4, wherein in the photoelectric conversion reading part of the pixel, the photoelectric conversion element and the transfer element are formed on the first substrate, and the floating diffusion, the first source-follower element, the reset element, and the output node are formed on the second substrate.

6. The solid-state imaging device as set forth in claim 4, wherein a drain side of the first source-follower element of the photoelectric conversion reading part can be selectively connected to a power supply potential or a reference potential, and a switching part of the connection potential is formed on the second substrate as a portion of the readout portion.

7. A method for driving a solid-state imaging device having a pixel portion in which pixels, each pixel including a photoelectric conversion reading part and a signal holding part, are arranged, a readout portion for reading pixel signals from the pixel portion,
a first signal line and a second signal line to which held signals of the signal holding part are output, wherein
a pixel signal read out from a pixel is a pixel signal including at least a readout signal and a readout reset signal,
the photoelectric conversion reading part of the pixel includes at least
an output node,
a photoelectric conversion element which stores a charge generated by photoelectric conversion in a storage period,
a transfer element capable of transferring the charge stored in the photoelectric conversion element in a transfer period,
a floating diffusion to which a charge stored in the photoelectric conversion element is transferred through the transfer element,
a first source-follower element which converts the charge of the floating diffusion to a voltage signal corresponding to the charge amount and outputs the converted signal to the output node, and
a reset element which resets the floating diffusion to a predetermined potential in a reset period, and
the signal holding part includes
an input node,
a first signal holding capacitor capable of holding a readout signal output from the output node of the photoelectric conversion reading part of the pixel and input to the input node,
a second signal holding capacitor capable of holding a readout reset signal output from the output node of the photoelectric conversion reading part of the pixel and input to the input node,
a first switch element which selectively connects the first signal holding capacitor with the output node of the photoelectric conversion reading part,
a second switch element which selectively connects the second signal holding capacitor with the output node of the photoelectric conversion reading part,
a first output part including a second source-follower element which outputs a signal held in the first signal holding capacitor in accordance with a held voltage and selectively outputting the converted signal to the first signal line, and
a second output part including a third source-follower element which outputs a signal held in the second signal holding capacitor in accordance with a held voltage and selectively outputting the converted signal to the second signal line, wherein
the device has a stacked structure which includes
a first substrate and
a second substrate,
the first substrate and the second substrate are connected through a connection part,
the first substrate is formed with at least a portion of the photoelectric conversion reading parts of the pixels, and
the second substrate is formed with at least the signal holding parts, the first signal line, the second signal line, and at least a portion of the readout portion,
the method for driving a solid-state imaging device comprising
when reading a pixel signal of a pixel,
connecting a drain side of the first source-follower element to a power supply potential,
when reading a readout signal as a pixel signal from a pixel, making the first switch element of the signal holding part conductive for a predetermined period and holding the readout signal in the first signal holding capacitor,
when reading a readout reset signal as a pixel signal from a pixel, making the second switch element of the signal holding part conductive for another predetermined period and holding the readout reset signal in the second signal holding capacitor,
in a state in which the first switch element and the second switch element are held in a non-conductive state, reading the converted signal corresponding to the readout signal to the first signal line by the first output part and reading the converted signal corresponding to the readout reset signal simultaneously in parallel to the second signal line by the second output part.

8. An electronic apparatus comprising
a solid-state imaging device and
an optical system forming a subject image in the solid-state imaging device, wherein
the solid-state imaging device has
a pixel portion in which pixels, each pixel including a photoelectric conversion reading part and a signal holding part,
a readout portion for reading pixel signals from the pixel portion, and
a first signal line and a second signal line to which held signals of the signal holding part are output, wherein
a pixel signal read out from a pixel is a pixel signal including at least a readout signal and a readout reset signal, and
the photoelectric conversion reading part of the pixel includes at least
an output node,
a photoelectric conversion element which stores a charge generated by photoelectric conversion in a storage period,
a transfer element capable of transferring the charge stored in the photoelectric conversion element in a transfer period,
a floating diffusion to which a charge stored in the photoelectric conversion element is transferred through the transfer element,
a first source-follower element which converts the charge of the floating diffusion to a voltage signal corresponding to the charge amount and outputs the converted signal to the output node, and
a reset element which resets the floating diffusion to a predetermined potential in a reset period, and
the signal holding part includes
an input node,
a first signal holding capacitor capable of holding a readout signal output from the output node of the photoelectric conversion reading part of the pixel and input to the input node,
a second signal holding capacitor capable of holding a readout reset signal output from the output node of the photoelectric conversion reading part of the pixel and input to the input node,
a first switch element which selectively connects the first signal holding capacitor with the output node of the photoelectric conversion reading part,
a second switch element which selectively connects the second signal holding capacitor with the output node of the photoelectric conversion reading part, a first output part including a second source-follower element which outputs a signal held in the first signal holding capacitor in accordance with a held voltage and selectively outputting the converted signal to the first signal line, and a second output part including a third source-follower element which outputs a signal held in the second signal holding capacitor in accordance with a held voltage and selectively outputting the converted signal to the second signal line, wherein the device has a stacked structure which includes a first substrate and a second substrate, the first substrate and the second substrate are connected through a connection part, the first substrate is formed with at least a portion of the photoelectric conversion reading parts of the pixels, and the second substrate is formed with at least the signal holding parts, the first signal line, the second signal line, and at least a portion of the readout portion.

9. The solid-state imaging device as set forth in claim 4, wherein the signal holding part includes an averaging part capable of selectively averaging a signal held in the first signal holding capacitor and a signal held in the second signal holding capacitor.

10. The solid-state imaging device as set forth in claim 4, wherein, in the signal holding part, a constant current source is connected to the input node.

11. The solid-state imaging device as set forth in claim 4, wherein the signal holding part includes a bypass switch selectively connecting the input node with the first signal line or the second signal line or another signal line.

12. The solid-state imaging device as set forth in claim 4, wherein the device includes a third signal line to which the read out signal of the photoelectric conversion reading part is output, and the photoelectric conversion reading part of the pixel includes a selection element which electrically connects the output node with the third signal line.

* * * * *